United States Patent [19]

Thomas et al.

[11] Patent Number: 4,589,074

[45] Date of Patent: May 13, 1986

[54] MULTIPLE CHANNEL POWER LINE MONITOR

[75] Inventors: Teddy R. Thomas, Renton; David L. Sommer, Everett; Greg J. Von Bokern, Kent, all of Wash.

[73] Assignee: The Boeing Company, Seattle, Wash.

[21] Appl. No.: 527,999

[22] Filed: Aug. 31, 1983

[51] Int. Cl.[4] ............................................. G01R 19/00
[52] U.S. Cl. .................................. 364/483; 364/481; 364/492
[58] Field of Search ............... 364/483, 481, 482, 492, 364/487, 480; 324/52, 112, 102, 113; 73/170 R, 73 AT; 179/175.3 F

[56] References Cited

U.S. PATENT DOCUMENTS

| | | | |
|---|---|---|---|
| 2,774,535 | 12/1956 | Anderson | 377/19 |
| 3,484,689 | 12/1969 | Kerns | 556/46 |
| 3,573,614 | 4/1971 | Wittbrodi | 324/102 |
| 3,629,852 | 12/1971 | Thexton et al. | 340/172.5 |
| 3,638,882 | 2/1972 | Turriere | 244/168 R |
| 3,662,380 | 5/1972 | Cargile | 340/347 AD |
| 3,700,336 | 10/1972 | Clegg | 356/226 |
| 3,795,861 | 3/1974 | Lazenby et al. | 324/102 |
| 3,820,112 | 6/1974 | Roth | 340/347 AD |
| 3,889,185 | 6/1975 | Wojtasinski et al. | 324/72 |
| 3,891,919 | 6/1975 | Penninger | 324/72 |
| 4,023,408 | 5/1977 | Ryan et al. | 73/170 R |
| 4,100,487 | 7/1978 | Wojtasinski et al. | 324/96 |
| 4,105,966 | 8/1978 | Lennon et al. | 324/102 X |
| 4,110,684 | 8/1978 | Gale | 324/51 |
| 4,115,732 | 9/1978 | Krider et al. | 324/72 |
| 4,138,660 | 2/1979 | Hill | 324/16 R |
| 4,156,182 | 5/1979 | Brick et al. | 324/72 |
| 4,187,461 | 2/1980 | Cox | 324/102 |
| 4,198,599 | 4/1980 | Krider et al. | 324/72 |
| 4,206,413 | 6/1980 | Cox et al. | 328/127 |
| 4,272,720 | 6/1981 | Lennon | 324/72 |
| 4,345,241 | 8/1982 | Takeuchi et al. | 340/347 CC |
| 4,484,290 | 11/1984 | Bagnall et al. | 364/483 |
| 4,495,642 | 1/1985 | Zellmer | 364/487 X |

OTHER PUBLICATIONS

"In-Flight Lightning Data Measurement System for Fleet Application", Von Bokern et al., FAA/Georgia Institute of Technology, May 4, 1978.

"In-Flight Lightning Data Measurement System for Fleet Application Flight Test Results", Von Bokern, G., paper presented at NACON, Dayton, Ohio, May 17, 1982.

*Primary Examiner*—Errol A. Krass
*Assistant Examiner*—Heather R. Herndon
*Attorney, Agent, or Firm*—James P. Hamley; Bernard A. Donahue

[57] ABSTRACT

A power line monitor capable of monitoring multiple power lines simultaneously includes a channel circuit for each monitored line, a common logic circuit and control logic. The signal on each power line is analog-to-digital converted and stored in channel circuit memory. A trigger detector produces a trigger detect signal in response to the monitored signal exceeding a preset limit. The trigger detect signal initiates a delay time during which the conversion and storing process in the triggered channel continues. The delay time is selected such that a desired amount of both pre- and post trigger data is retained in the associated channel memory. The control logic is operable in either a manual or an automatic mode. In the manual mode, memory stored data in a triggered channel is repetitively cycled to a digital-to-analog converter provided in the common logic, whereby an operator can monitor the stored waveform and, if desired, load the channel memory contents to magnetic tape. In the automatic mode, the control logic loads the associated channel memory directly to magnetic tape, then resets the channel in preparation for continued power line monitoring.

29 Claims, 25 Drawing Figures

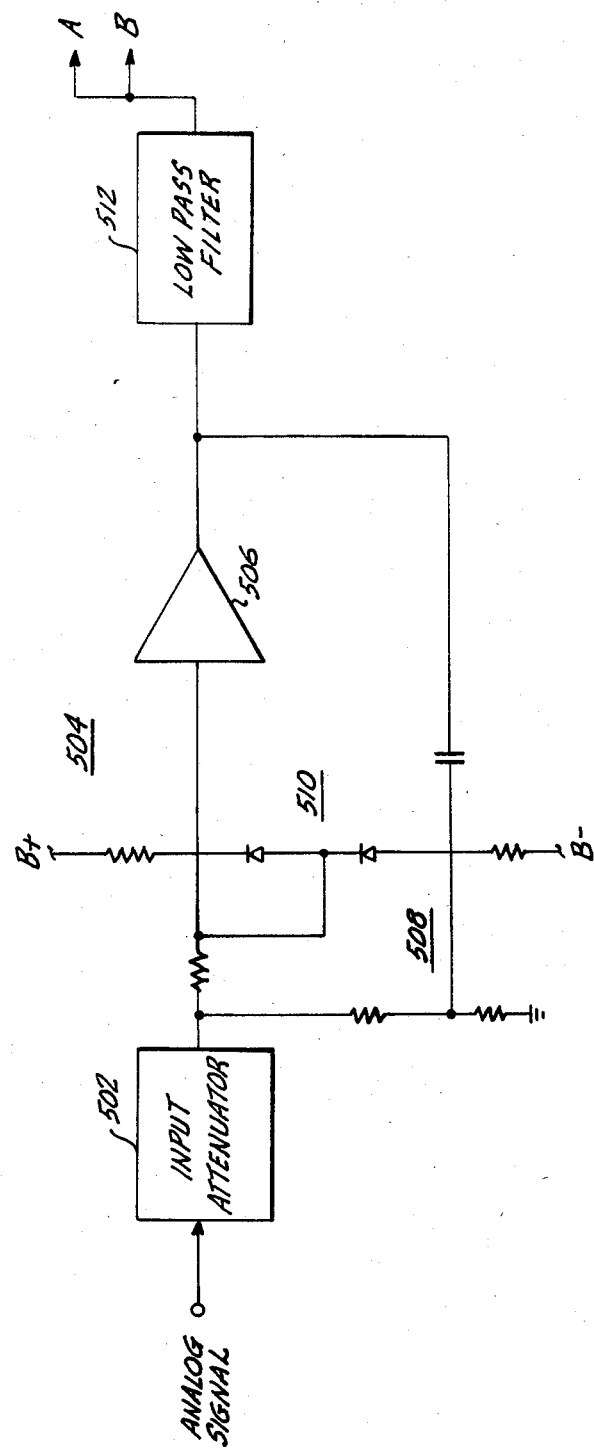

MULTIPLE CHANNEL POWER LINE MONITOR

BACKGROUND OF THE INVENTION

The present invention pertains to the electrical signal monitoring art and, more particularly, to apparatus for simultaneously monitoring multiple power carrying lines, detecting a transient condition on any line and storing data representing the waveform on the line both before and after the transient event.

The detection and analysis of disturbances on electrical power carrying lines has become an extremely important endeavor due to the widespread use of solid state computers and microprocessor based controllers. Such solid state equipment is known to be susceptible to damage, or operating fault conditions as a result of power line transients. Inasmuch as power line disturbances occur randomly and at widely spaced intervals, the study and analysis of such disturbances has proved difficult.

The present monitoring instruments for detecting power line transient disturbances include power line monitor/loggers and digital storage oscilloscopes. Conventional power line monitors are designed to detect the presence of relatively slow transient conditions, recording the time of occurrence and peak amplitude, but yielding no details on the waveform, pulse width or other patient factors of the transient. Whereas digital oscilloscopes are capable of capturing and displaying high speed transients, recording such waveforms for later analysis, they require the presence of an operator and, as such, are not well suited to the unattended monitoring of an electrical system.

An additional problem with conventional power line monitor/loggers and digital storage oscilloscopes is that they are typically not capable of monitoring several channels simultaneously. The origin of a transient condition is often not ascertainable unless several power lines are monitored simultaneously. Whereas, several individual power monitors or oscilloscopes may be provided to simultaneously monitor multiple power lines, such as exercise is expensive due to the need for redundant units.

A useful feature of a power line monitoring system is the ability to permanently store transient waveforms. Thus, it has been known to provide some form of permanent storage means, such as magnetic tape, into which may be loaded digital signals representing the waveform in question. Heretofore, power monitoring systems have operated either manually, such that an operator makes the decision to load a particular waveform into storage, or automatically, i.e., a detected transient signal is automatically transferred to permanent storage. The problem suffered by the manual systems is that they do not lend themselves to unattended power line monitoring. The fully automatic systems, on the other hand, suffer the drawback that the transient being stored in memory often yields no useful analytical information.

An additional desirable feature of a power line monitoring system is the ability to record both pre- and post trigger information. That is, such power line systems normally include a triggering device for sensing the occurrence of a transient disturbance. In oscilloscope monitoring systems, it is the presence of this transient detect signal which triggers the oscilloscope sweep. However, a full analysis of the origin of the transient may not be possible without reviewing the electrical waveform on the power line just prior to the transient. Further, post trigger waveform information is also often of use in analyzing the cause of a disturbance. The ability to capture both pre- and post trigger waveform activity is, therefore, often essential to a full analysis of the disturbance.

For power monitoring systems which are capable of monitoring multiple power lines simultaneously, system operation may be substantially enhanced if a central controller is provided to process transients stored in each channel in an orderly manner, resetting the channels to a condition for further signal reception. Absent some means for processing the data stored in each of the channels, and returning each processed channel to an active monitoring state, such a multichannel system may miss transients which occur on the monitored lines subsequent to a prior transient.

Further, in multichannel monitoring systems wherein stored transient waveforms are to be committed to permanent memory, it would be useful to provide a means for allowing an operator to select the file size of each channel memory which is to be committed to permanent storage. In this way, the processing time for each channel may be kept to a minimum and maximum use may be made of the permanent storage facility.

In addition, for monitoring systems employing analog-to-digital converters, a means for allowing an operator to select the sampling rate of each channel's converter in a multiple channel monitoring system is desirable. High frequency transient signals require a high frequency sampling rate to successfully capture the transient. However, for relatively low frequency transients, it is preferred to take samples less often, thereby preserving memory space.

A yet further desirable feature in a multiple channel power line monitoring system is the capability of channel triggering in a master/slave mode. Often, a transient on one power carrying line will produce a response on other lines. This response may not be of sufficient magnitude to trigger the detection circuitry for those other channels. As such, it would be desirable to provide a means whereby a transient in one channel causes a corresponding triggering of other selected channels, whereby the total effect of the transient disturbance may be evaluated.

Additional desired features of such power line monitoring systems include means for recording the time at which a particular disturbance occurred and, where permanent storage means are used, means for providing a backup storage, such that the backup system takes over when the primary system is fully loaded.

SUMMARY OF THE INVENTION

It is an object of this invention, therefore, to provide an improved multiple channel power line monitoring system, which system does not suffer the limitations of prior power line monitoring systems, and which system provides all of the above described desirable features.

Briefly, according to the invention, apparatus for monitoring a plurality of electrical power carrying lines includes a plurality of channel circuits, a common logic circuit and a control logic. Each channel circuit includes an input adapted to be coupled to one of the power carrying lines for sensing the signal thereon. A trigger detector produces a trigger detect signal in response to the sensed signal at the input exceeding a predetermined reference level. An analog-to-digital converter controllably converts the sensed signal at the input to corresponding digital signals. These digital signals are controllably stored in a provided memory. A timing and control circuit responds to control signals for controlling the analog-to-digital converter and the memory.

The common logic circuit includes a sampling clock generator which produces a sampling clock signal. This sampling clock signal is coupled to each channel circuit timing and control circuit for controlling the sampling rate of each corresponding analog-to-digital converter. In addition, channel select logic responds to controlsignals for selecting a predetermined one of the plurality of channel circuits. A digital-to-analog converter converts the stored digital signals in a selected channel circuit memory to a corresponding analog signal.

The control logic controls the operation of the channel circuits and the common logic in either a selected manual or an automatic mode. The control logic includes storage means for controllably storing digital signals. In its manual mode, the control logic responds to a trigger detect signal produced by the trigger detector of a channel circuit to cause the channel select logic to select that channel circuit such that an analog signal out of the digital-to-analog converter is produced for review by an operator. The operator is provided with a means for loading the digital signals stored in the memory of the selected channel circuit into the storage means. In its automatic mode, the control logic operates to respond to a trigger detect signal produced by the trigger detector of a channel circuit to cause the memory of the selected channel circuit to automatically load its digital signals into the storage means.

To provide for both pre- and post trigger signal capture, the timing and control circuit includes a means for controlling the associated memory of a circuit channel such that in the absence of a trigger signal being produced by an associated trigger detector, successive digital signals from the analog-to-digital converter are stored in successive memory locations of the memory until the memory is fully loaded, at which point subsequent digital signals are stored in successive memory locations thereby erasing the previously stored digital signals. In this manner, the digital signals stored in the memory at any given time represent the most recent, successive analog-to-digital produced digital signals. Further, the timing and control circuit means controls the memory such that upon the occurrence of a trigger signal from an associated trigger detector in the same channel circuit, the memory is caused to inhibit storing additional digital signals once it has stored a predetermined number of digital signals subsequent to the occurrence of the trigger signal. In this way, the memory is controlled to store a predetermined number of digital signals prior, and subsequent to the occurrence of the trigger signal.

The number of digital signals stored both prior, and subsequent to the occurrence of the trigger signal is, preferably, under operator control.

A priority control system is provided by the control logic including means operable in the manual mode and the automatic mode for assigning a predetermined priority to each of the channel circuits such that in the event at least two channel circuit trigger detectors produce trigger signals simultaneously, each channel circuit is processed in the order of its assigned priority.

A provided means resets a channel circuit once the data stored in the memory thereof has been processed.

The file size of data which is to be transferred from the memory of a channel circuit to storage is controlled by the control logic which includes means for allowing an operator to select a predetermined portion of the digital signal stored in each channel circuit memory, and load only that selected portion into storage.

Operator control of the sampling rate of each channel is provided by a sampling clock generator which produces a plurality of sampling clock signals, each sampling clock signal being of a different predetermined frequency. The control logic includes operator input controls for controlling the timing and control circuit of each channel circuit such that a user selected one of the sampling clock signals is coupled to the associated analog-to-digital converter for controlling the sampling rate thereof.

A provided means establishes a trigger link relationship between any two or more operated selected channel circuits such that a trigger detect signal produced by one channel causes a trigger detect signal to be produced in the other channels. The trigger linked channels may either be linked on an equal basis or a master/slave relationship may be established whereby a master channel triggers all slave channels whereas triggering of a slave channel does not trigger the master channel or other slave channels.

The control logic also includes, preferably, a real time clock for producing a digital time signal representative of real time and means for storing a digital time signal in the storage in association with loading digital signals from the memory means into the storage. Further, the control logic includes means for storing channel attenuator and sampling rate settings.

Where the storage comprises first and second magnetic tape units, the first magnetic tape unit stores successive digital signals loaded into the storage means and the control logic senses the condition wherein the first magnetic tape unit is fully loaded to automatically begin storing successive digital signals into the second tape unit.

BRIEF DESCRIPTION OF THE DRAWINGS

FIGS. 10A through 10D are detailed schematic diagrams of the front end portion of a channel circuit;

DETAILED DESCRIPTION

Figure 1:
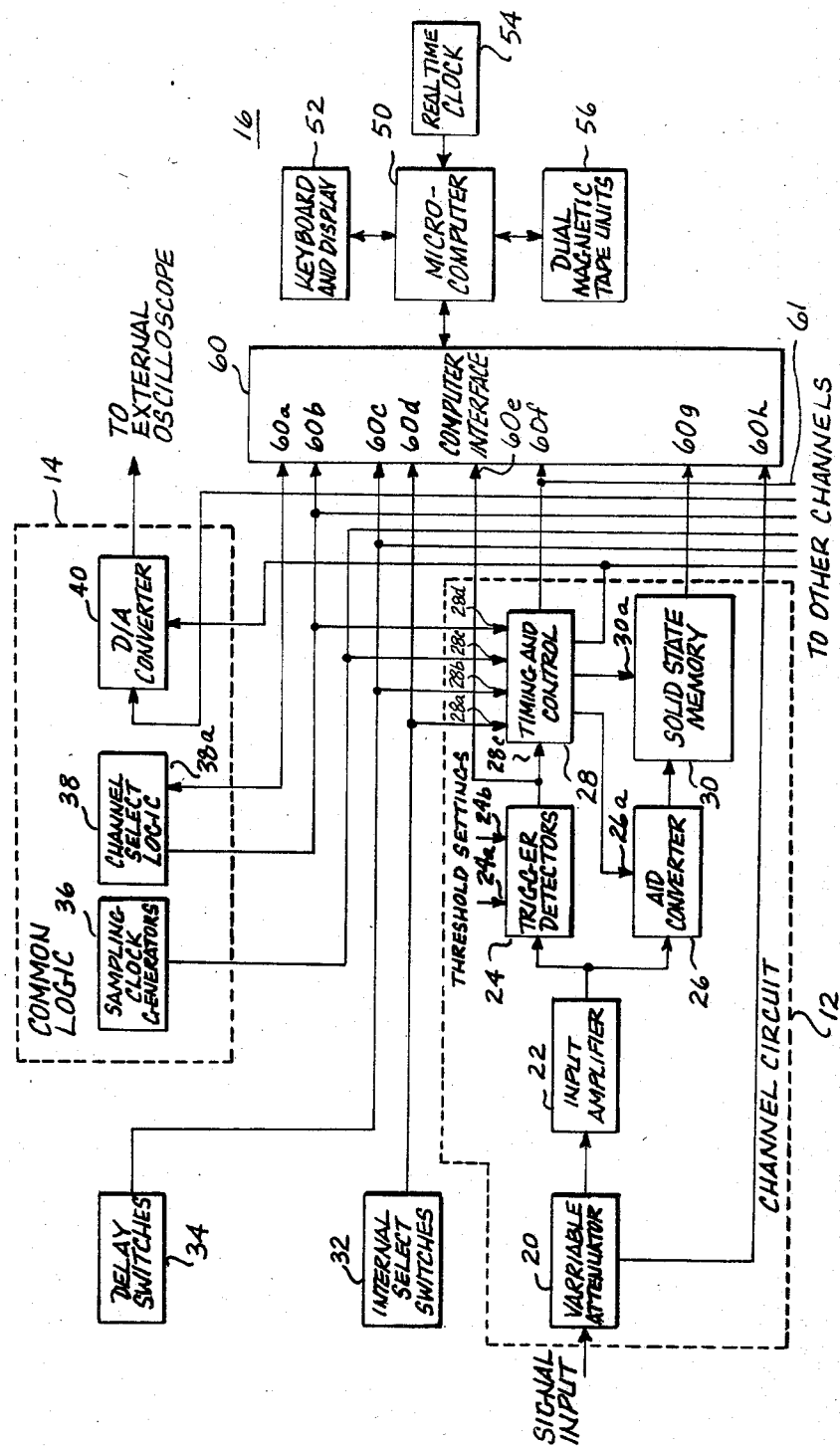
FIG. 1 is a block diagram illustrating the principal components of a channel circuit, common logic, and control logic which form the preferred power line monitoring system.

FIG. 1 is a block diagram illustrating the principal components of the present multiple channel power line monitoring system, including a channel circuit 12, common logic 14 and control logic, indicated generally at 16.

A channel circuit 12 is provided for each power line to be monitored. Only one channel circuit is shown in FIG. 1, it being understood that the other channel circuits are of identical construction.

The signal from a monitored power line is applied at the input of channel circuit 12 to a variable attenuator 20. Variable attenuator 20, of conventional design, provides an attenuation level to the input signal which may be user controlled via a control panel (see FIG. 3). An operator selects the attenuation level corresponding to the level of signal anticipated on the power line, and the sensitivity of the channel circuit.

The output from variable attenuator 20 is buffered, via an input amplifier 22, with the resultant output signal being applied both to the input of the trigger detector 24 and to the input of an analog-to-digital (A/D) converter 26. The trigger device 24 produces an output trigger detect signal in response to the signal at its input being less than a lower limit or greater than an upper limit. These lower and upper limits are operator settable via threshold setting inputs 24a, 24b. The values of the threshold settings are selected to define those power line signals which represent disturbances on the line.

Analog-to-digital converter 26 is of conventional design, and responds to signals at its input to produce corresponding digital signals, at a sampling rate determined by a clock signal, at its clock input 26a. This clock signal is provided through a timing and control circuit 28.

The digital signals out of A/D converter 26 are passed to the input of a solid state memory 30. The memory 30 also receives a timing signal from timing and control circuit 28 at a timing input 30a. Digital signals provided by A/D converter 26 are successively stored in memory locations within solid state memory 30 at the clock rate applied to the memory.

The timing and control circuit 28 has four (4) input control ports 28a through 28b. The first control input port 28a is connected to an internal select switch set 32. Inasmuch as several channel circuits 12 are provided in a single system, a means must be provided to assign unique address to each channel circuit. Such unique address is provided by the internal select switch set 32.

Applied to the second input port 28b of timing and control circuit 28 is the output from a delay switch set 34. The delay switches 34 are provided on the front panel (see FIG. 3) and allow operator control over the amount of pre- and post trigger information which is stored in memory 30 in response to a transient trigger detect signal.

The third input 28c to timing and control circuit 28 comprises the output from the sampling clock generators 36 provided in the common logic 14. The sampling clock generators 36 produce a series of clock signals, each of which runs at a predetermined frequency. An operator of this system, by actuating a suitable switch (see FIG. 3) couples a given one of these clock signals to the input of the timing and control circuit 28, whereby this signal is used as the clock input 26a of the A/D converter 26.

The fourth input, at input port 28d to timing and control circuit 28 is from the output of a channel select logic block 38 provided in the common logic 14. In the event the memory within a channel circuit is to be processed, the channel select logic 38 issues an appropriate signal which activates the timing and control circuit of the appropriate channel to institute memory data flow.

A further provided component of the common logic 14 is a digital-to-analog (D/A) converter 40. As will be understood more fully with respect to the discussion hereinbelow, in the manner mode of operation the data stored in a selected channel circuit memory is recirculated through the D/A converter 40 such that converter 40 produces an output signal which is a reconstruction of the waveform stored within the memory 30. The reconstructed signal may be applied to the input of an external oscilloscope for viewing by an operator to determine whether or not the stored waveform should be committed to permanent memory.

The control logic 16 has as its principal controlling element a microcomputer 50. Microcomputer 50 receives inputs from, and provides outputs to an operator's keyboard and display unit 52.

In addition, microcomputer 50 receives a time signal from a real time clock 54.

The microcomputer 50 may load information to, and receive data from dual magnetic tape units 56.

The microcomputer 50 interfaces with the channel circuit 12 and common logic 14 via a computer interface 60. Interface 60 has an output port 60a permitting the computer to couple control signals to an input 38a of the channel select logic 38. At an input port 60b, the computer receives commands produced by channel select logic 38. The setting of the delay switches 34 is monitored by the computer via interface input port 60c, whereas the status of the internal select switches 32 is computer monitored via interface input port 60d.

A trigger detect signal, produced by a trigger detector 24 is monitored by the computer via interface input port 60e. The status of the timing and control circuit 28 is computer monitored, via an interface input port 60f. The data stored within solid state memory 30 is received by the computer 50 through an interface port 60g, with an input port 60h receiving the status of the variable attenuator 20.

A trigger link line 61 provides trigger chaining among selected channel circuits.

In operation, the signal on the power line being monitored is attenuated by attenuator 20, buffered by amplifier 22 and continuously applied to the input of the A/D converter 26. The A/D converter 26, in turn, constantly produces output digital signals which are loaded into successive memory locations in the solid state memory 30.

In the absence of a trigger detect signal from detector 24, the memory 30 will continue to be loaded until it is full, at which point successive digital signals from converter 26 "write over" the initial signals stored in the memory 30. In this way, memory 30 contains the most recent generated digital signals from converter 26.

In the event a transient on the power line exceeds the threshold settings at threshold inputs 24a, 24b of trigger detector 24, a trigger detect signal is produced at the detector output. This trigger detect signal is both routed to input port 60e of computer interface 60, thereby notifying the computer of the transient, and is applied to an input 28e of the timing and control circuit 28. In response to receiving a trigger detect signal, timing and control circuit 28 initiates a time delay having a period which is determined by the setting of the delay switches 34. During the delay period, the A/D converter 26 and solid state memory 30 continue in the normal manner to process the input signal, and store the resulting digital levels. However, at the conclusion of the delay interval, the timing and control circuit 28 issues a signal which, when applied to the input 30a of memory 30, "freezes" the memory contents.

A trigger detect signal in one channel circuit may be coupled to other channel circuits, for simultaneous triggering thereof, via trigger link line 61.

Figure 2:
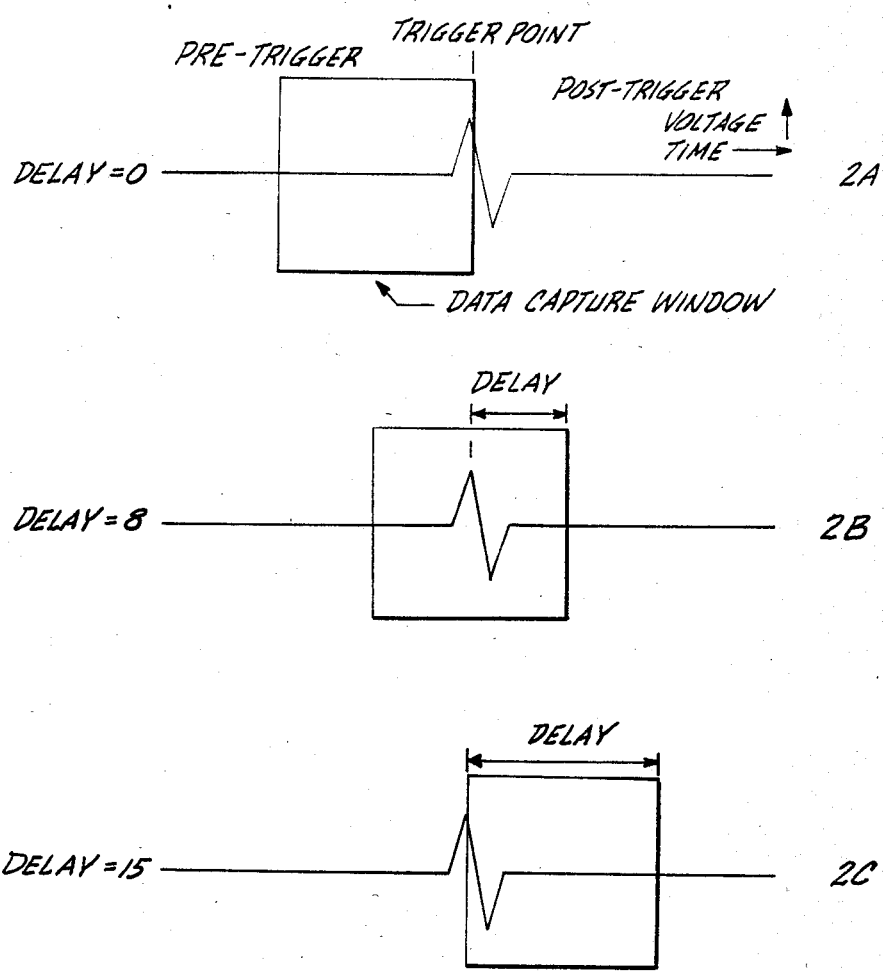
FIGS. 2A, 2B and 2C are waveform diagrams illustrating operation of the preferred technique for capturing a selected amount of both pre- and post trigger information.

FIGS. 2A through 2C illustrate the present technique for controlling the amount of pre- and post trigger data which is stored as a function of the selected delay time. In one embodiment of the invention, an operator is allowed to select sixteen (16) different delay levels, identified as 0–15. The zero level represents zero delay, whereas the 15 level represents maximum delay.

Referring to FIG. 2A, the input waveform is assumed to reach the threshold detect level at the indicated trigger point. Inasmuch as the delay time has been set at 0, the timing and control circuit 28 will immediately "freeze" the contents of the solid state memory 30. In this way, the data stored in memory 30 will be all pre-trigger information.

In FIG. 2B, an operator has selected a midvalue delay of 8. Here, the "data capture window" appears to move the right, whereby an equal amount of pre- and post trigger data has been captured.

Finally, in FIG. 2C the operator has selected the maximum delay of 15. Thus, following the trigger point, data continues to be read into memory for the full delay. In so doing, any pretrigger information which was in memory is "written over" by subsequent post trigger information. The full delay period represents, therefore, 100% post trigger data.

Referring again to FIG. 1, the microcomputer 50 periodically monitors the computer interface port 60e checking for a trigger detect condition. Assuming the microcomputer 50 receives a trigger detect signal from channel circuit 12, it is programmed to react in either a manual or an automatic mode to process the data stored in the memory of the channel circuit. In the manual mode, the microcomputer 50 issues a control command signal to the output port 60a of the interface 60 which, in turn, is applied to the input 38a of the channel select logic 38. This command signal causes the channel select logic to apply a signal at the input 28d of the timing and control circuit 28 which, in turn, causes timing and control circuit 28 to begin clocking data stored within memory 30 to the input 40a of the D/A converter 40. A timing signal from timing and control circuit 28 clocks the D/A converter 40 at the frequency at which the data was originally loaded into the solid state memory 30. Thus, produced out of D/A converter 40 is a reconstruction of the waveform which has been stored. This waveform may then be viewed by an operator, such as via an external oscilloscope, so that the operator may determine whether the waveform should be loaded into permanent storage. If he decides to store the data, he enters a suitable input on his keyboard 52 whereby the digital data out of memory 30 is routed to the computer interface port 60g through the microcomputer 50 and directly into one of the dual magnetic tape units 56. Once all of the data has been dumped from the memory 30 to the permanent storage magnetic tape unit 56, the channel circuit is reset and armed for further signal monitoring.

If, however, the operator decides that the waveform is not worth storing, he enters a suitable input via his keyboard 52 whereby the channel circuit 12 is directly reset, and monitoring continues as before.

For instances wherein an operator is not present to select the data to be stored, the system is operable in an automatic mode.

In the automatic mode, the microcomputer 50 responds to a trigger detect signal from channel circuit 12 to directly load the contents of solid state memory 30 through computer interface 60 and microcomputer 50 into the dual magnetic tape units 56. After the contents of memory 30 have been stored on tape, microcomputer 50 issues a control signal to the interface output port 60a which, in turn, applies the signal to the input 30a of the channel select logic 38. In response to the control signal, the channel select logic 38 applies a control signal to the input port 28d of the timing and control circuit 28. Timing and control circuit 28 responds to the control signal to reset the memory 30, and allow memory 30 to resume storing successive digital signals out of the A/D converter 26.

A further feature of the present power line monitoring system is the capability to store only a selected file from the channel circuit memory into permanent storage. If the operator determines, at set-up time, that only, for example, the first quarter of the expected waveform needs to be stored for analytical purposes, he inputs a command via his keyboard 52, whereby the microcomputer 50 causes only the first quarter of the stored data points in memory 30 to be loaded into the magnetic tape units 56. By allowing control over the file size to be directed to permanent storage, the present system makes maximum use of its storage capabilities and minimizes the time that a channel circuit is out of its power line monitoring mode.

For instances wherein the microcomputer 50 receives trigger signals simultaneously from different channel circuits, a priority system is implemented to process each channel efficiently. Each channel circuit is assigned a priority by the operator via the internal select switches 32. The microcomputer 50 is programmed to process first those channel circuits having the highest assigned priority. These, therefore, are the channel circuits which are most quickly returned to normal operation.

The data stored by the microcomputer 50 into the magnetic tape units 56 includes not only the digital signals stored within a particular channel circuit memory, but also the identification of the selected channel, as sensed by the microcomputer at its interface input port 60d from the internal select switches 32, as well as a time signal, as provided by real time clock 54, and, in addition, the settings of the variable attenuator and the sampling rate selector for the channel circuit being selected, as provided at interface input port 60h.

The dual magnetic tape units 56 are comprised of first and second independent tape units. The units are arranged such that when the first tape unit becomes fully loaded, the last data point on that tape is transferred as the first data point on the second tape, with the second tape unit thereafter storing subsequent input data points. In this way, no data is "lost" from permanent storage.

Figure 3:
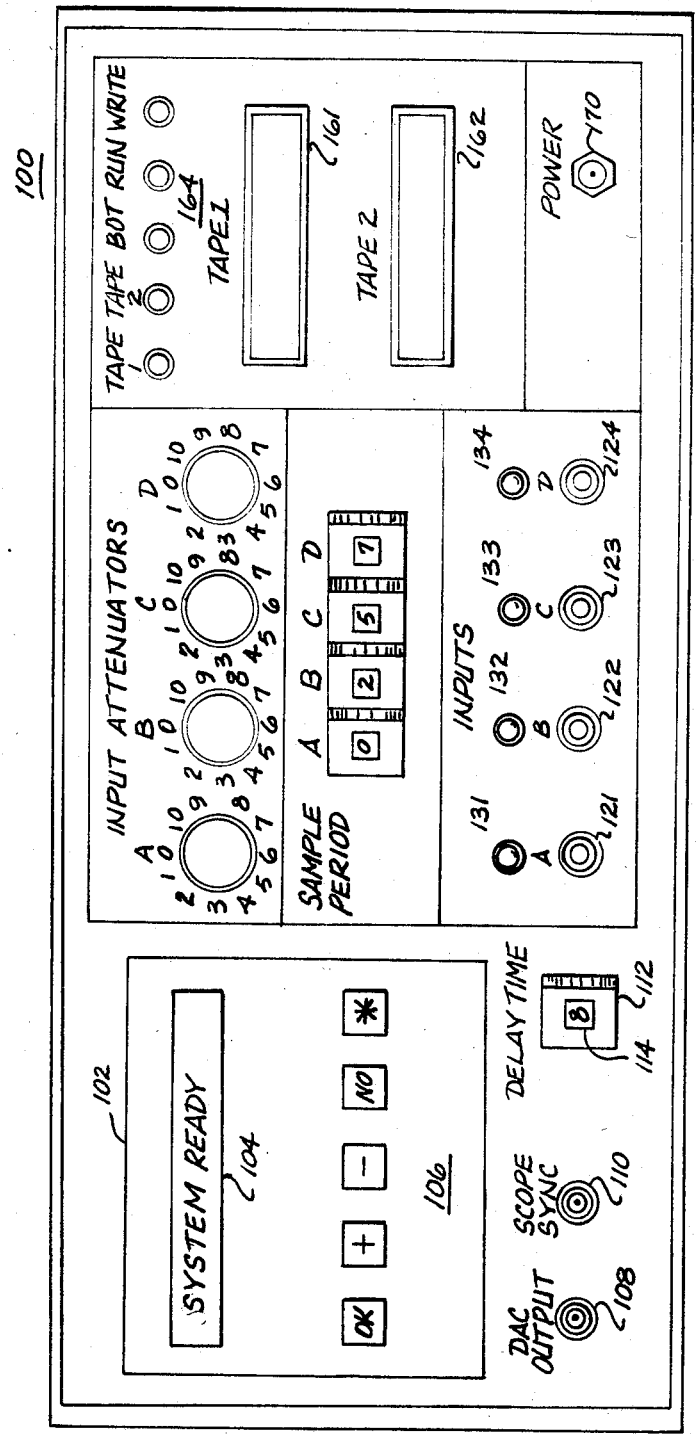
FIG. 3 is a plan view of the preferred control panel for use with the present power line monitoring system.

FIG. 3 illustrates the layout of the operator's control panel for use in one embodiment of the power line monitoring system. Here, the control panel, indicated generally at 100 includes a keyboard and display portion 102. An electronic display 104 is comprised of a series of alphanumeric light emitting diode characters. Under computer control, display 104 is activated to indicate various status and prompt signals, such as that illustrated "SYSTEM READY."

Directly beneath display 104 are a series of five push buttons comprising a keyboard, indicated generally at 106. In a manner discussed with reference to FIGS. 4 through 8, an operator, by pressing a selected one of the keyboard switches 106 inputs an appropriate control command. The push buttons are designated, reading left to right, "OK", "+", "−", "NO" and "*".

Directly below the keyboard/delay portion 102 are a pair of BNC-type jacks 108, 110. Jack 108, labeled "DAC output" carries a reconstructed stored waveform as, for example, may be supplied out of the D/A converter 40 of FIG. 1. This signal may be coupled to the input of an external oscilloscope (not shown), as may be designated "SCOPE SYNC" output provided by jack 110.

To the right of the jacks 108, 110 is a "DELAY TIME" thumb wheel switch 112. The position of thumb wheel switch 112 is indicated by a read out 114. The switch 112 may be set in any one of sixteen (16) positions, designated correspondingly 0–15. As is described with respect to FIGS. 1 and 2, an operator sets delay time switch 112 to a desired delay interval setting corresponding to the amount of pre- and post trigger information which is to be stored. The indicated setting of "8" corresponds to an equal amount of pre- and post trigger information. By suitably setting delay time switch 112, an operator sets the delay time for all channel circuits connected to the system.

Immediately to the right of the delay time switch 112 are a series of four BNC jacks 121 through 124. Each jack 121 through 124 corresponds to the inputs of each of four channel circuits A through D. Positioned over each of the jacks 121 through 124 is an indicator 131 through 134, respectively, which lights when a corresponding channel is triggered.

Directly above the indicators 131 through 134 is a set of four thumb wheel switches, indicated generally at 140. Each thumb wheel switch 140 corresponds to one of the channels A through D. The thumb wheel switches 140 select the sampling period to be used in each of the corresponding channel circuits. A digital read out immediately to the left of each thumb wheel switch indicates, from 0 to 9, the sampling period selected. In one embodiment of the invention, a thumb wheel setting of 0 corresponds to a sampling interval of 0.2 microseconds with each integer increment therefrom doubling the preceding interval. That is, a setting of 1 corresponds to a 0.4 microsecond interval, a setting of 2 corresponds to a 0.8 microsecond interval and so forth.

Above the sampling period thumb wheel switches 140 is a set of four input attenuators 151 through 154. Each input attenuator corresponds to the attenuation of the signal at the input to each of the four channels A through D. An increasing attenuation setting corresponds to an increased attenuation of the input signal.

Directly to the right of the sampling period thumb wheel switches 140 are a pair of first and second tape drives 161, 162, respectively. The tape drives 161, 162, in the conventional manner, receive and utilize tape cassettes which are used as the permanent storage means for the system.

Directly above the tape units 161, 162 are a series of five status lights, indicated generally at 164 which indicate the status of the tape drives 161, 162. Reviewing the indicators from left to right, the "TAPE 1" indicator is lighted when the first drive 161 is active. Similarly, the "TAPE 2" indicator is lighted corresponding to the second tape unit 162 being activated. The "BOT" light corresponds to a beginning of tape condition. The "RUN" indicator lights in response to the tape being in motion. the "WRITE" indicator lights to indicate that data is being recorded.

Finally, a master power switch 170 is provided in the lower right hand corner of the panel 100.

FIGS. 4 through 8 are detailed logic flow diagrams illustrating the sequential steps executed by the power line monitor system.

Figure 4:
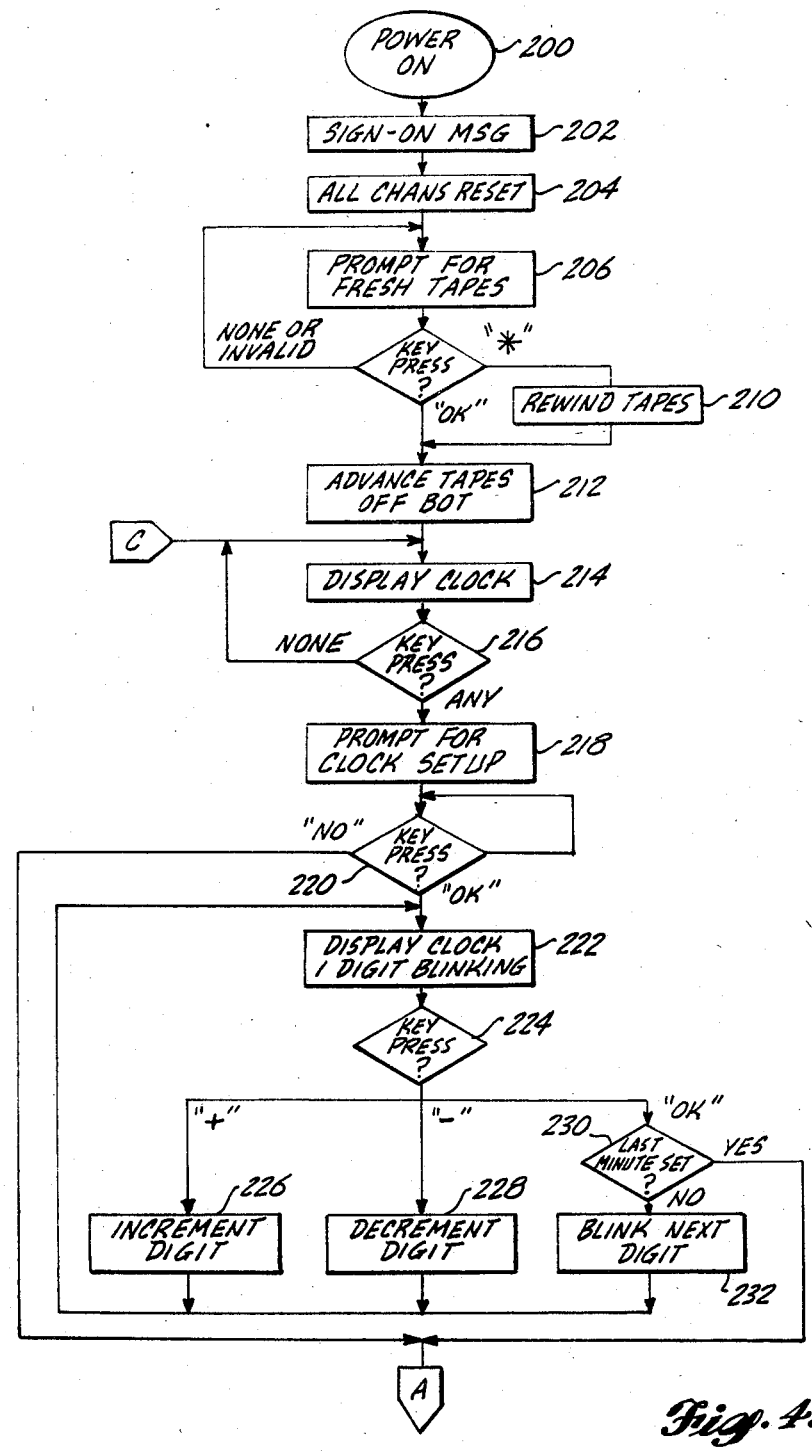
FIGS. 4 through 8 are logic flow diagrams illustrating each sequential logic step performed by the present apparatus.

Referring to FIG. 4, and with reference to the control panel of FIG. 3, operation of the power line monitor begins at a "power on" block 200 by activation of the power switch 170. Immediately, an appropriate sign-on message, block 202, appears on the front panel display 104, indicating system operation.

Next, all channels are reset, block 204, and the channel trigger lights 131 through 134 are extinguished until a subsequent trigger condition is detected. Also, an appropriate reset signal appears on display 104.

Display 104 then prompts for fresh tapes to be loaded, at block 206.

Throughout the balance of the set-up procedure, the display 104 prompts for push button inputs from push buttons 106. Most prompts may be answered with "OK" (YES) or "NO" to proceed to the next step. Numeric entries are solicited by a blinking numeral in the display prompt. The blinking numeral's value can be changed by pressing the "+" button to increment, or the "−" button to decrement. In all cases, invalid button inputs are ignored. However, if a valid but incorrect data entry is made, once the "OK" or "NO" button has been pressed to advance to the next entry the error cannot be corrected without repeating the set-up.

At block 208, the operator is given the option, via a prompt in display 104, of hitting the "*" push button to rewind tapes at 210 or the "OK" push button to advance the tapes off of their initial position, at 212.

The main set-up procedure, excluding installation of tapes in tape drives 161, 162, begins with the time-of-day clock being displayed as day (three digits, 000–999), hour (two digits, 0–23), minutes (two digits, 0–59) and seconds (two digits, 0–59).

At initial start-up, the clock will read zero plus the minutes and seconds since starting on the display 104, at display clock block 214. Upon depressing any push button 106, at key press prompt 216, the display 104 gives a clock set-up prompt at block 218. Here, by depressing the "NO" push button, the operator can avoid clock set-up. Otherwise, the "OK" button is depressed, at block 220, to thereby initiate the clock set-up process. If the "OK" button is depressed, the current clock reading is displayed on display 104 with the first digit (hundreds of days) blinking at block 222. Now, at key press block 224, the operator has the option of incrementing the days digit by depressing the "+" push button at increment digit block 226, decrementing the display digit, by hitting the "−" push button at decrement digit block 228, or depressing the "OK" push button. After the proper day has been entered, the "OK" push button is depressed and, at block 230 a test is made to determine whether or not the last minute has been set. Since it has not, the operator depresses the "NO" push button which causes the second day digit to blink at block 232. This process is repeated until all of the day, hour, and minute entries have been made. At this point, when the "OK" button is depressed, the test at 230 is satisfied whereby the clock set-up is complete.

Figure 5:
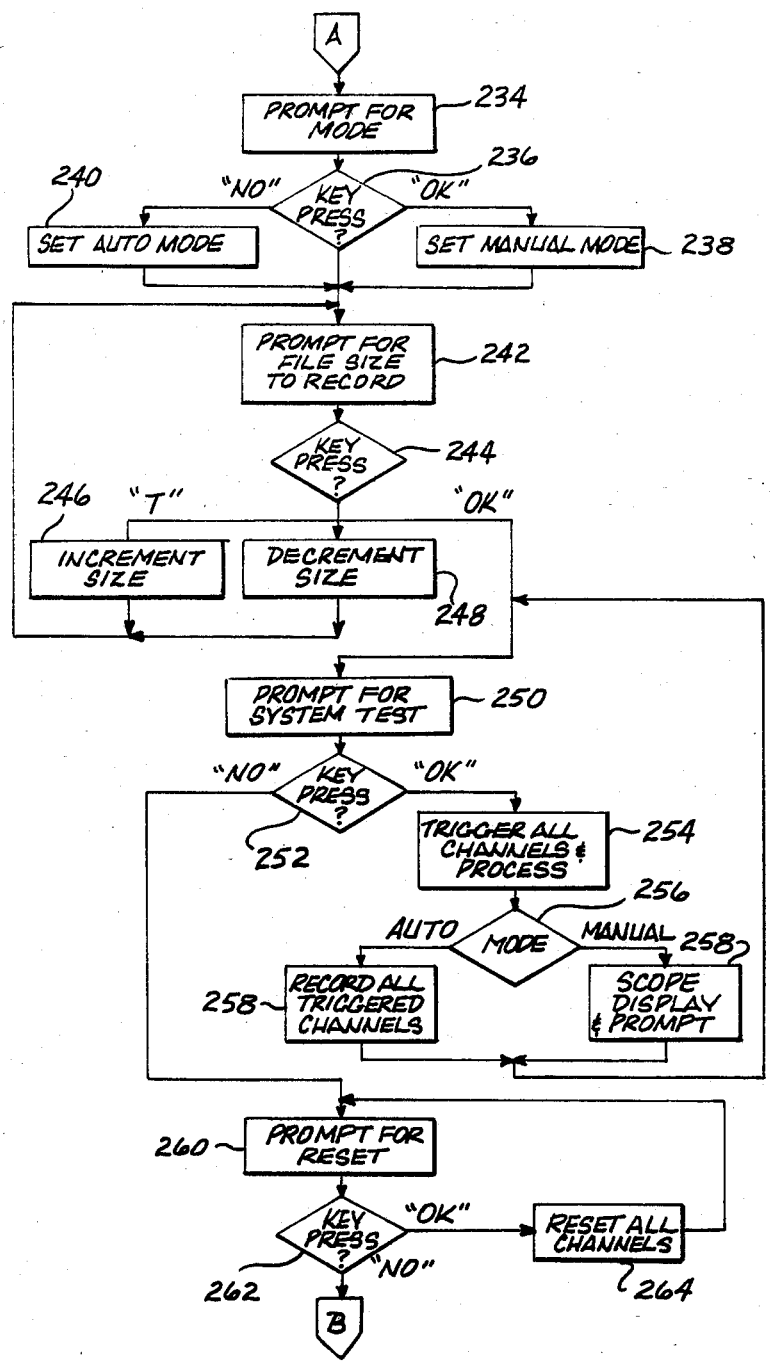

Referring now to FIG. 5, the next prompt, at block 234 is for the desired operating mode. The display 104 will show "MANUAL MODE?", the operator responding with either depression of the "NO" or "OK" push button, at key press prompt 236. Pressing the "OK" push button selects the manual mode, at block 238, whereby the system couples the digital-to-analog converter output to the output jack 108, with an appropriate scope synchronization signal applied to output 110. If, however, the "NO" push button has been depressed, the automatic mode is set at block 240, with data recorded immediately upon a trigger event being detected.

The next prompt, at block 242, allows the operator to select the file size of each channel memory which is to be recorded on tape. A prompt is displayed on display 104 of "FILE SIZE 4?" with the number blinking. Here, "file size" refers to the amount of captured data to be recorded on the tape in increments of 2K (kilobyte) samples. Thus, a file size of 4 records 8K samples, a file size of 8 records 16K samples, and so forth. Using smaller file sizes is advantageous in many cases where the transient is relatively short, since smaller files use less tape and take less recording time. At key press prompt 244, the operator may either increment the file size by depressing the "+" push button at block 246 or decrement the file size by depressing the "−" push button at block 248. Once the desired file size has been entered, the "OK" push button is depressed.

Next, a system test prompt is given at block 250. The operator, at key press prompt 252 either avoids the test, by depressing the "NO" push button, or enters the test mode, by depressing the "OK" push button. If the test mode has been selected, a triggered condition is forced on all channels at block 254. If the system is in the automatic mode, as determined at block 256, the data from all channels are recorded, at block 258. If the system is in the manual mode, the oscilloscope output jacks 108, 110 are activated, and a prompt is given to the operator allowing him to record the data of a desired channel.

The next prompt, at block 260, is for manual reset of all channels. At key press block 262 the operator may depress either the "OK" push button, to reset all channels at block 264, or he may depress the "NO" push button, to exit from the reset mode.

Figure 6:
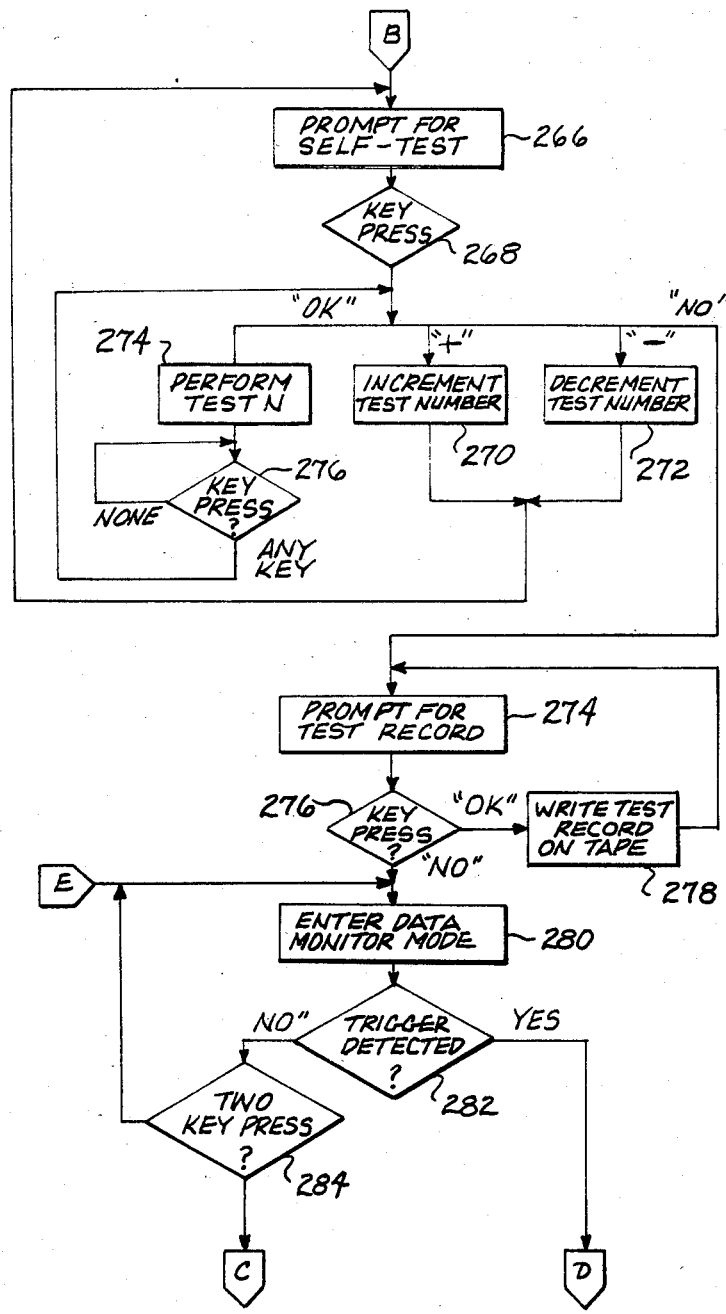

Referring to FIG. 6, at block 266 a self-test prompt is given. The system may be provided with any number of user defined test conditions arranged to force a high or low level at any controlled output. These tests may be selected at key press prompt 268 by using the "+" push button to increment to a desired test number, at block 270, or the "−" push button to decrement to a desired test number at block 272. Once the desired test number is entered, the test is performed at block 274. Upon completion of the test, depression of any push button at key press prompt 276 allows selection of a different test. Once all self-testing has been completed, exit may be made by depressing the "NO" push button.

The last prompt in the set-up mode is for a test record, at block 274. At key press prompt 276 an operator presses the "OK" push button to cause a short test record to be written on the tape at block 278. The test record includes real time information, the interval settings as entered by a user via thumb wheel controls 140, and the attenuator settings as entered by an operator via controls 151 through 154 for each channel. To exit from the test record mode, the operator depresses the "NO" push button.

Next, at block 280, the system enters the monitor mode, looking for a triggered channel. Prior to a trigger detect condition, at block 282, an operator may return to the clock set-up point by pressing any push button 106 twice in rapid succession, at key press 284. In this way, the system reverts (see arrow C) to the display clock block 214 of FIG. 4.

With the system at the trigger detect block 282, all channels are continuously digitizing and storing input data while simultaneously monitoring for trigger conditions (i.e., either threshold exceeded). In the absence of trigger detect signals, the channel indicators are off and each channel operates autonomously. The control logic merely maintains the time-of-day clock and periodically checks for a push button command to the set-up mode, as described above.

When a trigger detect signal is produced by any channel, the appropriate channel indicator 131 through 134 will light above that channel's input connector 121 through 124. If the control logic detects that one or more channels have been triggered, it selects the highest priority trigger channel for processing.

Figure 7:
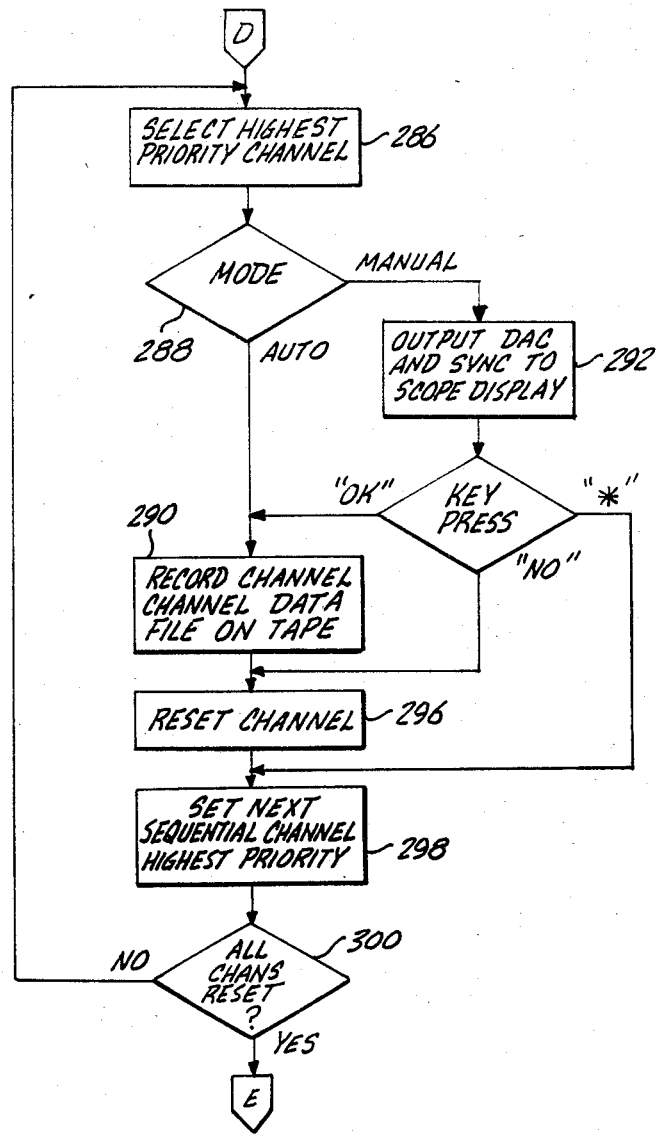

Referring to FIG. 7, the channel selected is determined by a priority scheme, at block 286, such that each triggered channel is processed in turn. Next, the control logic determines which operating mode has been selected, at block 288. If the automatic mode has been selected, the control logic immediately begins transferring the channel's data to tape, at block 290. An appropriate display on display 104 will indicate that the data transfer is taking place and the tape RUN and WRITE lights 164 will flash for each sample record written. When the preselected file size has been recorded, the control logic resets the channel, extinguishing its indicator light and returning it to normal monitoring.

If the system is operating in its manual mode, the highest priority channel has its stored data reconstructed by the digital-to-analog converter (40 of FIG. 1) and routed to the external oscilloscope connectors, at block 292. The display 104 will alternately flash the channel identification and a "RECORD?" prompt. The operator depresses the "OK" push button, at key press prompt 294, to cause the data in that channel to be recorded on tape. Depression of the "NO" push button causes the trigger channel to be reset, at block 296. If the operator wants to observe the next highest priority signal, he depresses the "*" push button, which avoids resetting and clearing the previous channel's data. In this way, the operator may cycle through all trigger channels and observe the captured data display before deciding to record or reset any channel. The next sequential channel is selected at block 298 and the test is made at block 300 to determine whether or not all channels have been reset. In either the automatic or the manual mode, when a channel is reset its captured data is lost and normal monitoring is restored until the occurrence of a subsequent trigger detect signal. Another transient event may then be captured by the restored channel, even if other channels are being processed. The "dead time" in which a channel cannot capture a new transient is only the time to process that channel and any previous channels in the priority sequence.

If all channels have not been reset at block 300, the system loops back to select the highest priority channel block 286 and repeat the procedure. If all channels have reset, the system returns to the data monitor mode 280 (see arrow E in FIG. 6).

Figure 8:
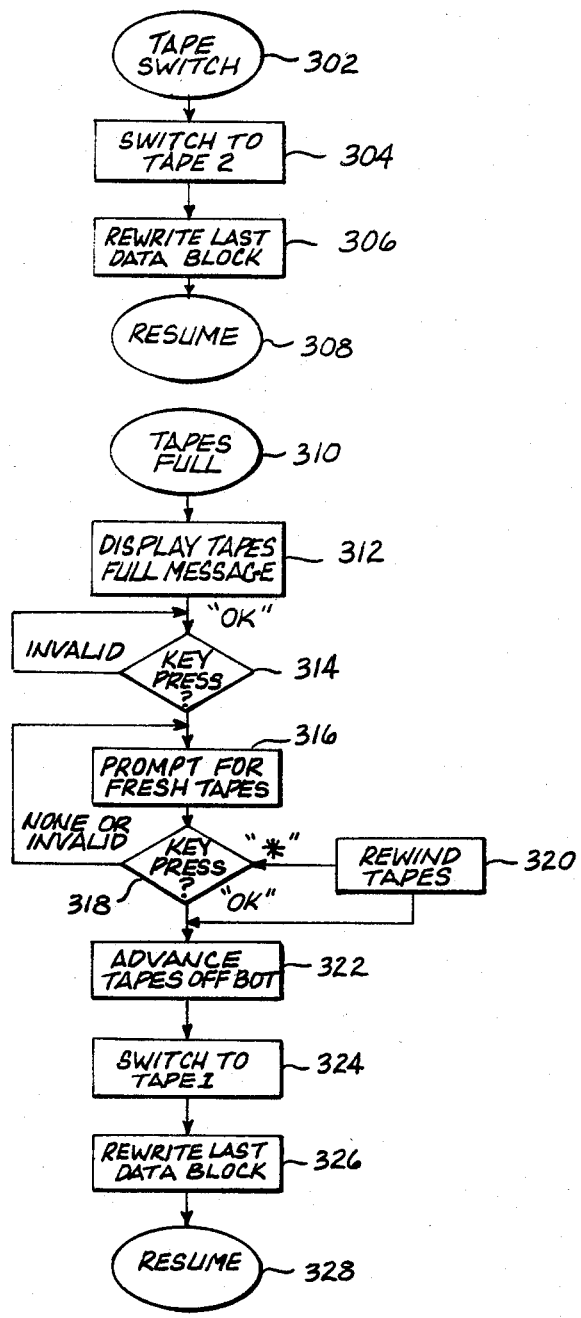

FIG. 8 depicts the steps taken by the control logic to operate the tape drives 161, 162. When the control logic detects that the first tape is full, by detecting a switching action at the end of the first tape at block 302, the second tape is switched in at block 304. To avoid a loss of data in the record at the end of tape occurrence, the last record on the first tape is rewritten on the second tape, at block 306. The "TAPE 1" and "TAPE 2" lights in tape indicator group 164 indicate which of the two tape units is active. Recording on the second tape then resumes at block 308. If the second tape unit becomes full, as detected at block 310, an all tapes "FULL" message is displayed on display 104, at block 312. All current captured data is retained and may be recorded by installing fresh tapes. Depression of the "OK" push button in response to the end of tape message produces, via key press prompt 314, a prompt for fresh tapes at block 316. At key press prompt 318, an operator may depress the "*" push button to rewind tapes at block 320 or he may depress the "OK" push button to advance the newly installed tapes at block 322. The system will then switch back to the first tape drive unit, at block 324 and the last record before the end of tape will be recorded on new "TAPE 1" at block 326 with the taping process resuming, at block 328.

Thereafter, the tapes may be processed in any appropriate reader. In the preferred embodiment of the invention, the tapes are read on a Sea Data Corp. Micrologger Reader. This unit is capable of inputting the recorded information and transmitting ASCII-coded data to an external device via an EIA RS-232C serial data port. The external device may be a printer, CRT terminal or a host computer.

Figure 9A:
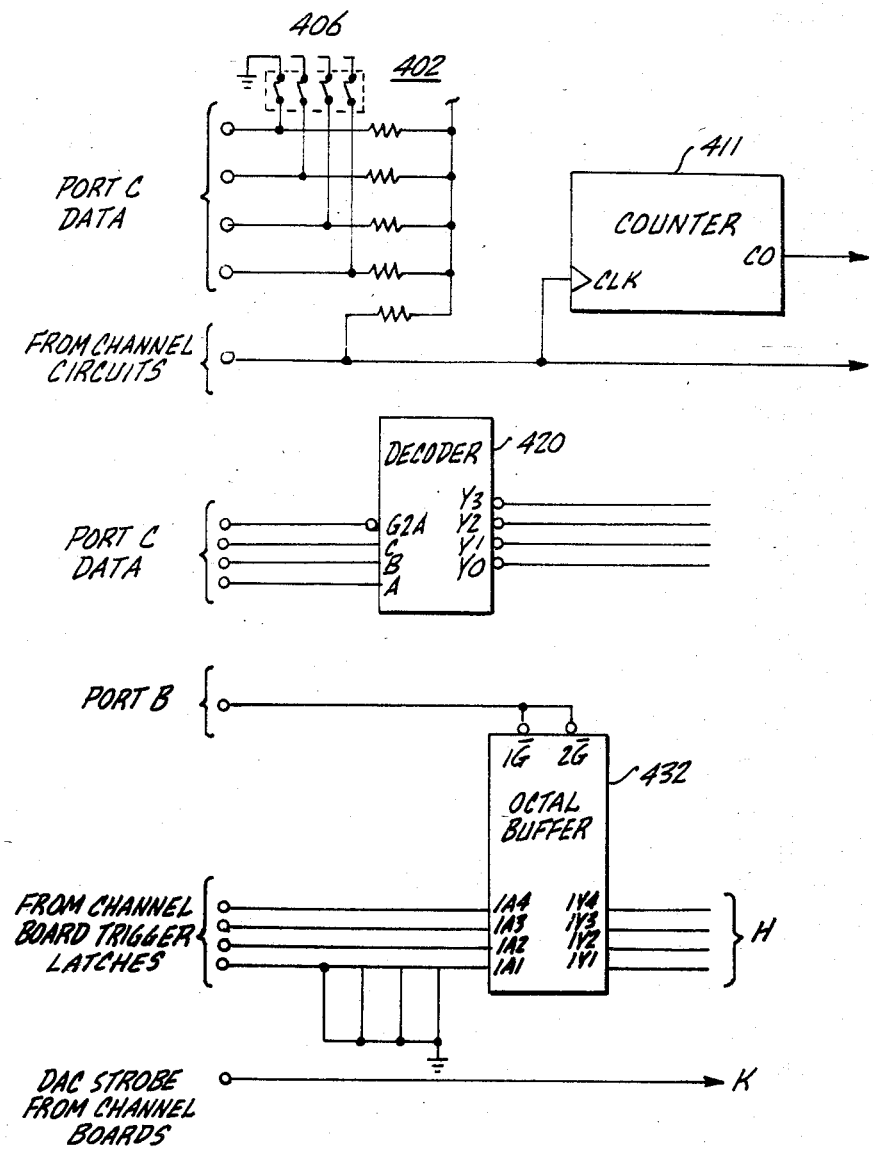
FIGS. 9A through 9C are detailed schematic diagrams showing the preferred construction of the common logic circuitry.
Figure 9B:
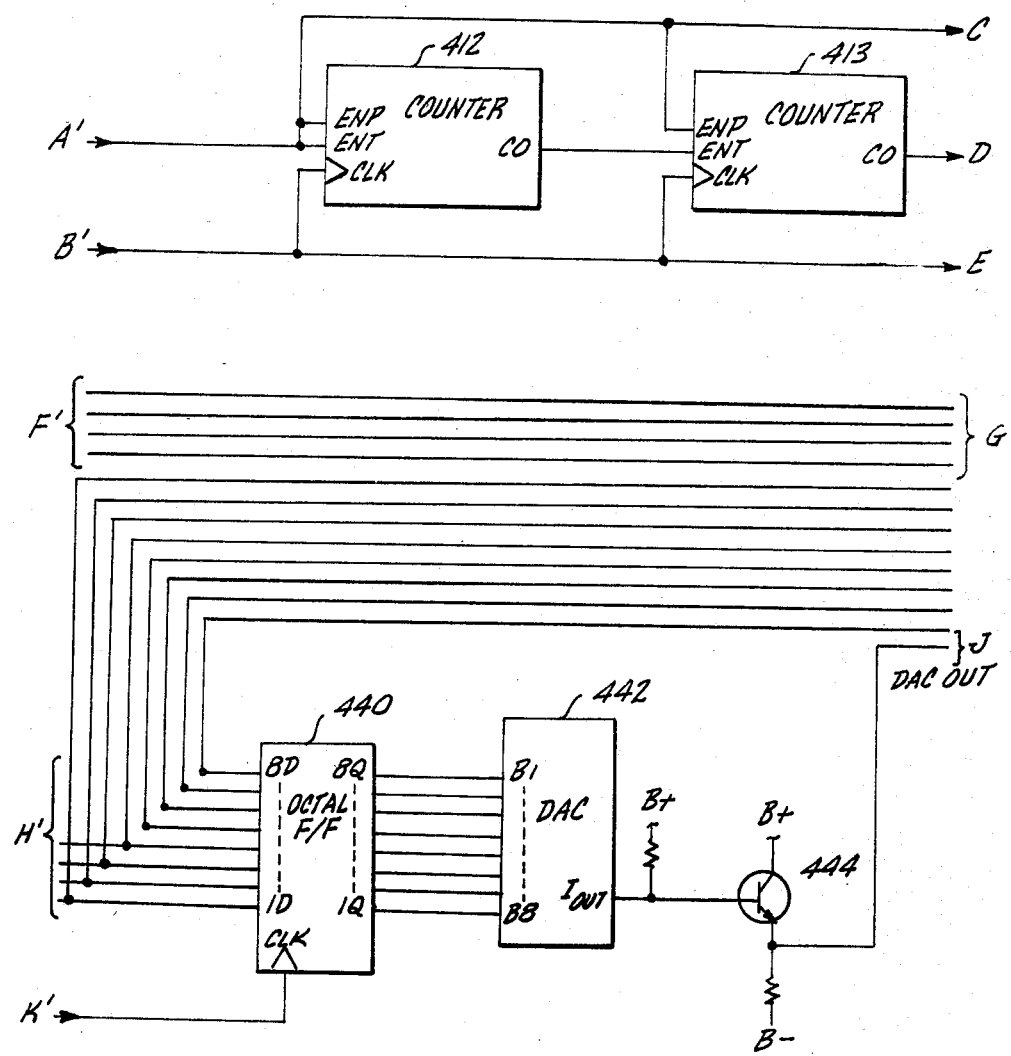
Figure 9C:
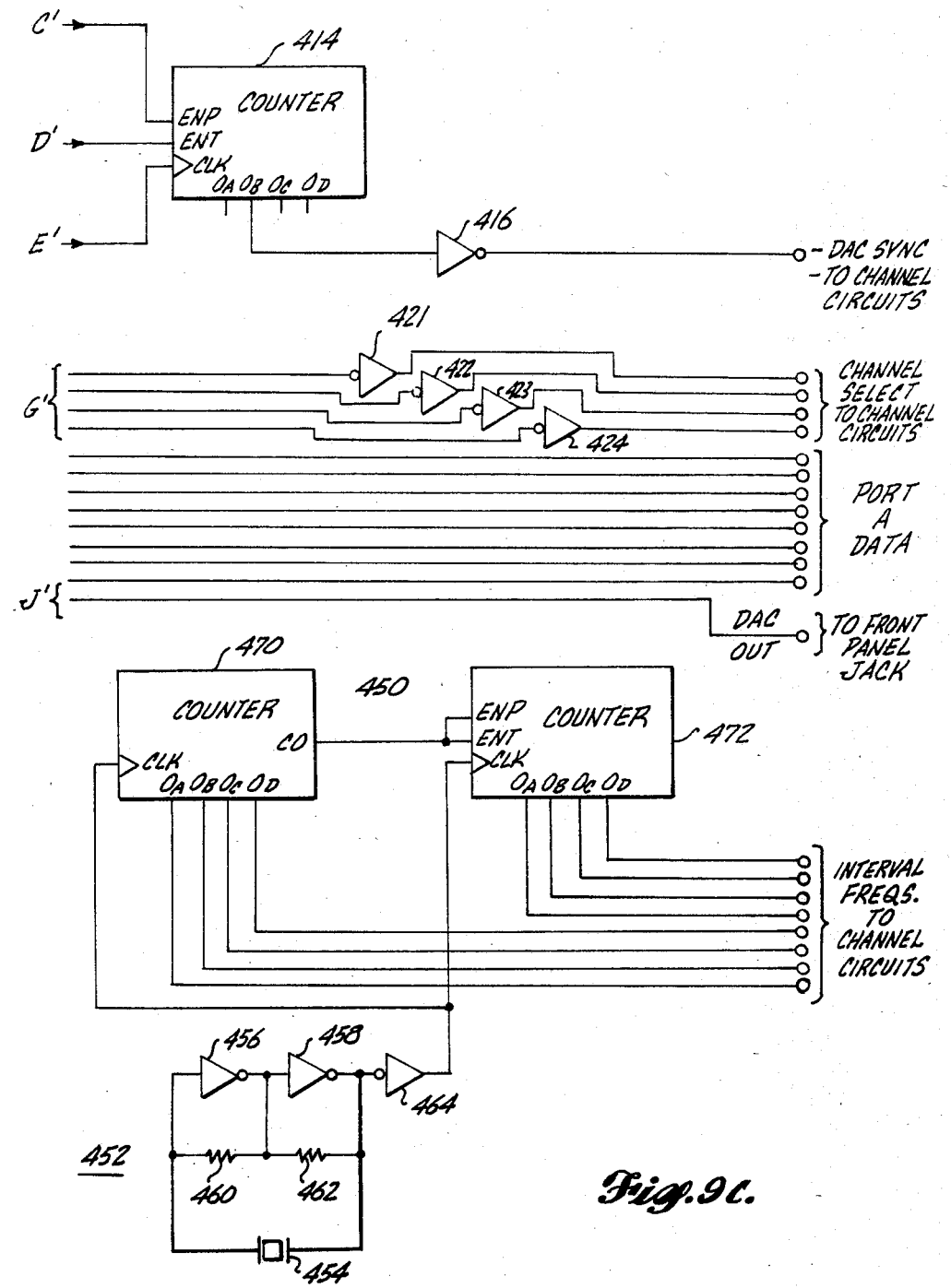
Figure 10B:
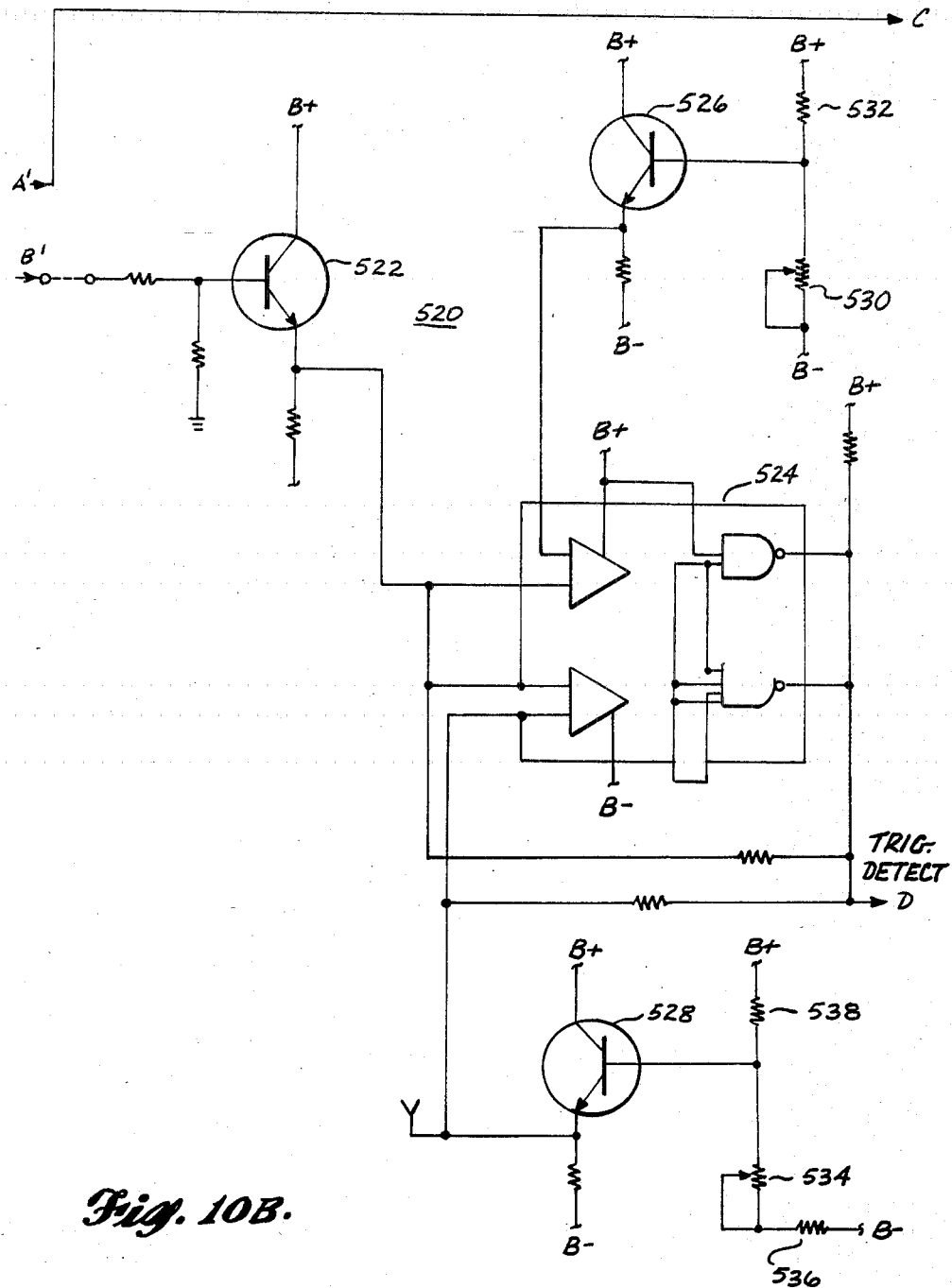
Figure 10C:
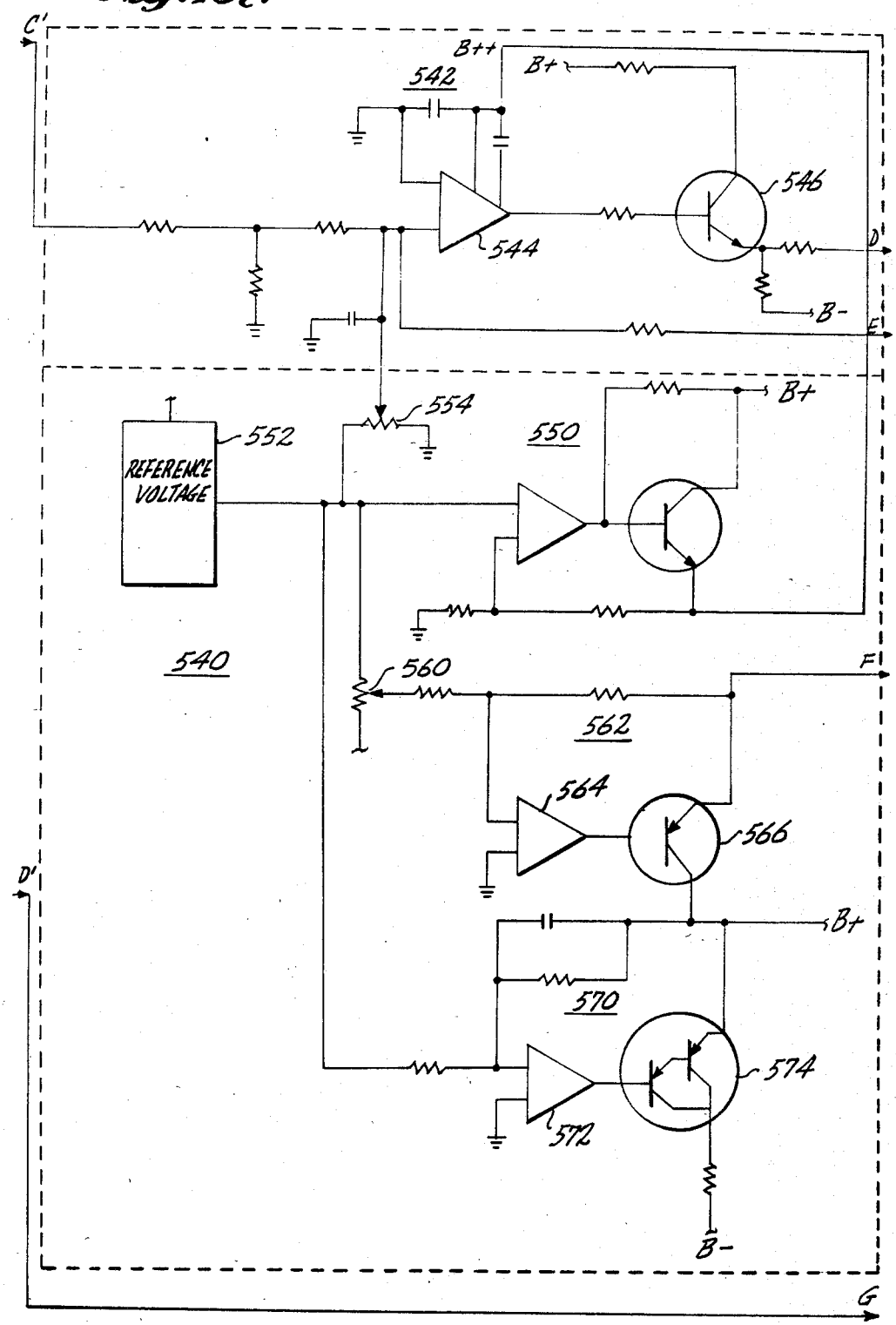
Figure 10D:
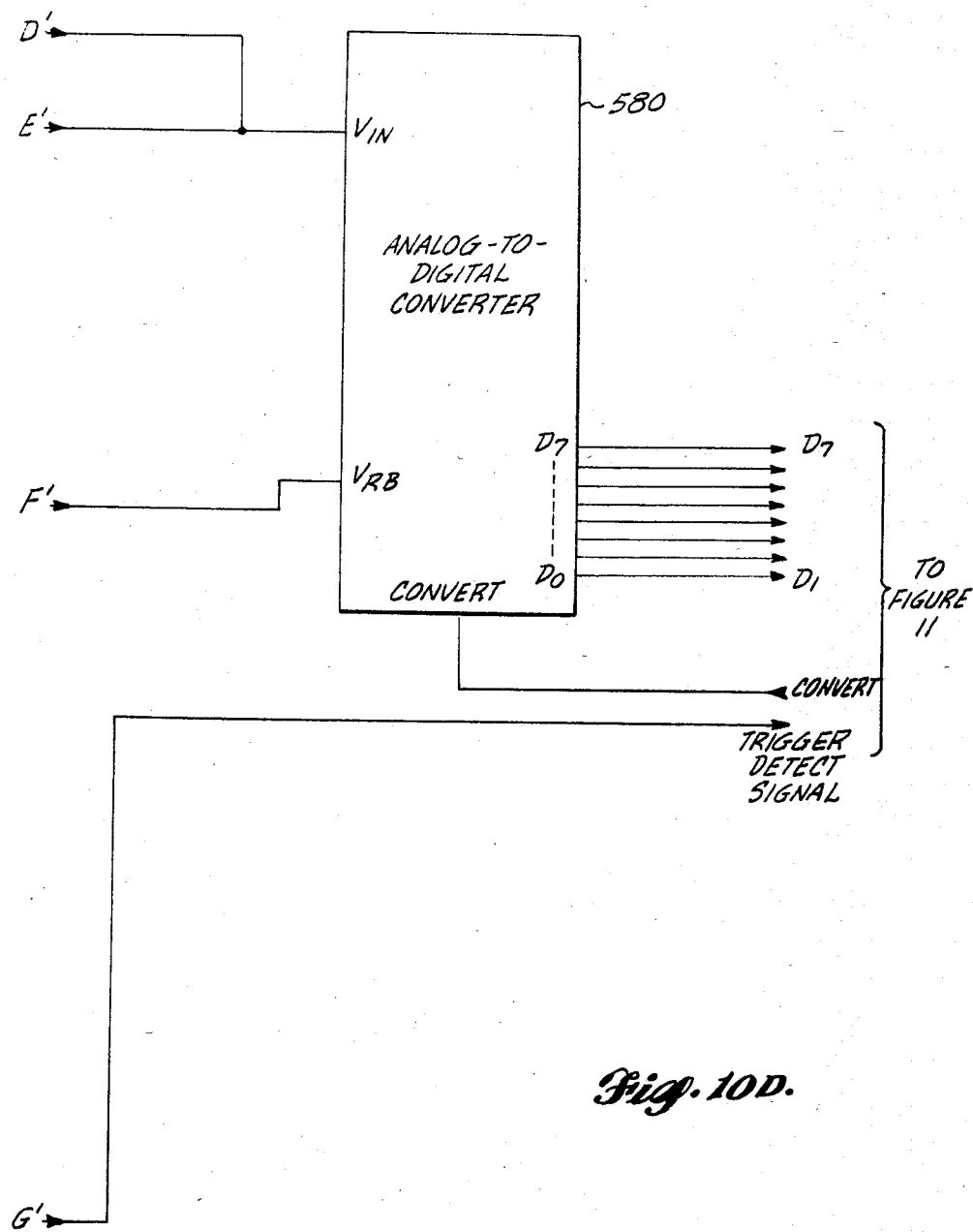
Figure 11A:
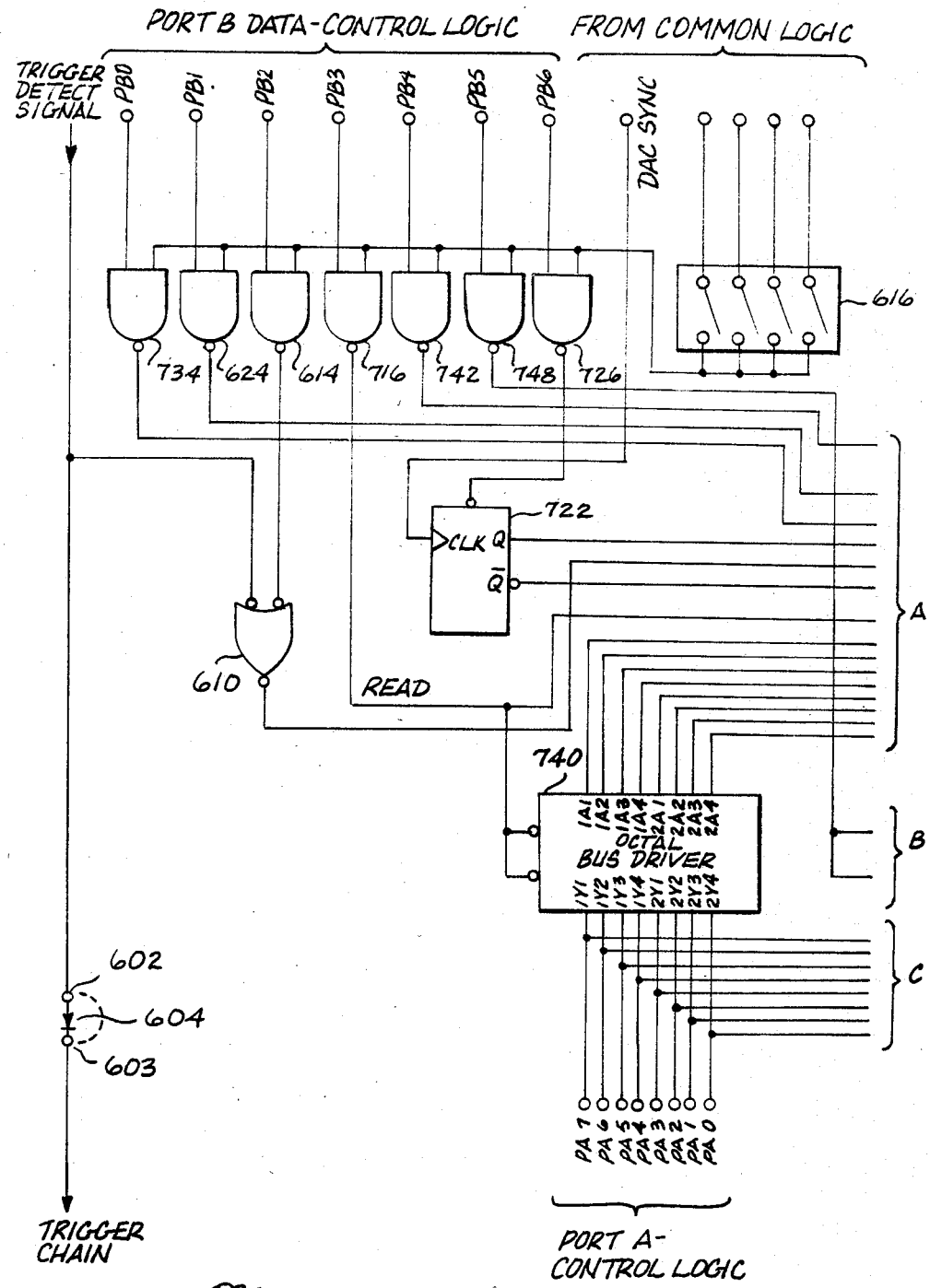
FIGS. 11A through 11G are detailed schematic diagrams of the second portion of the channel logic circuit.
Figure 11B:
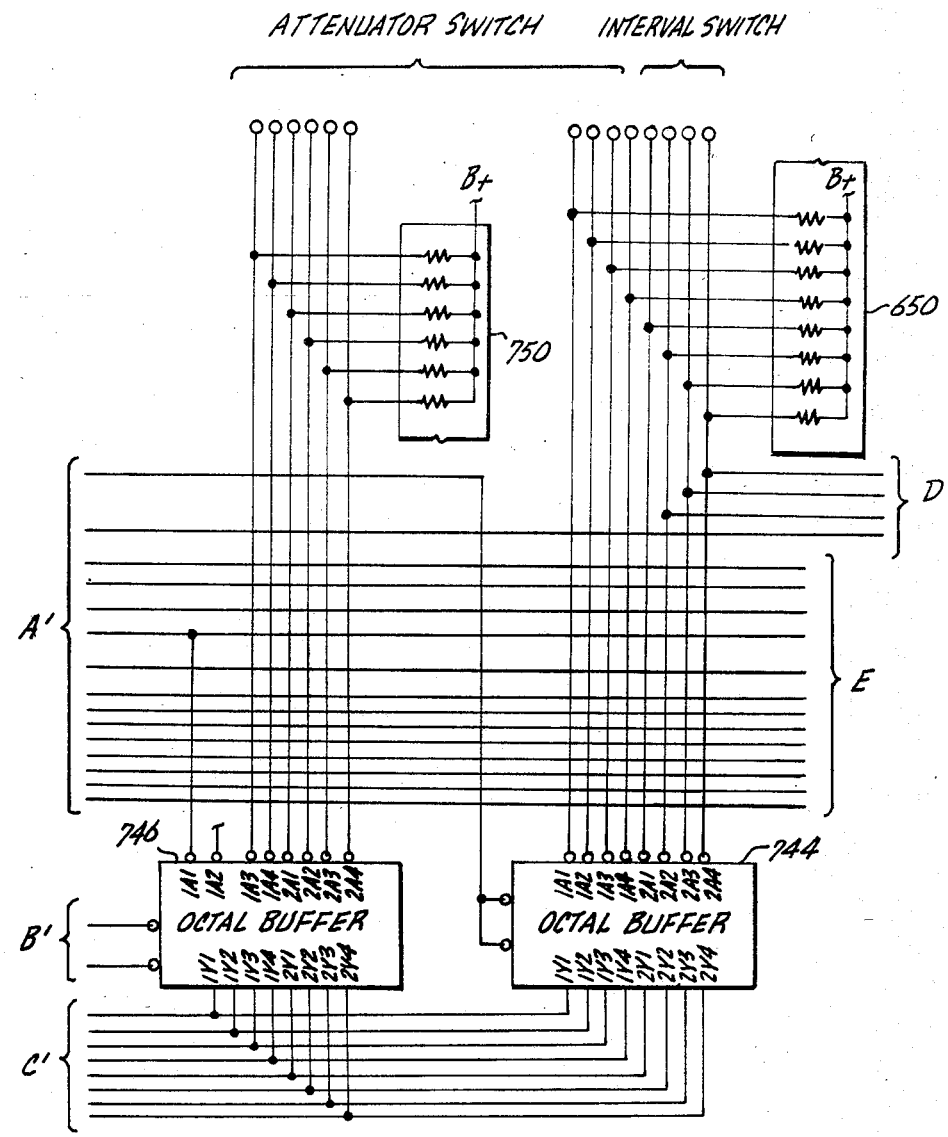
Figure 11C:
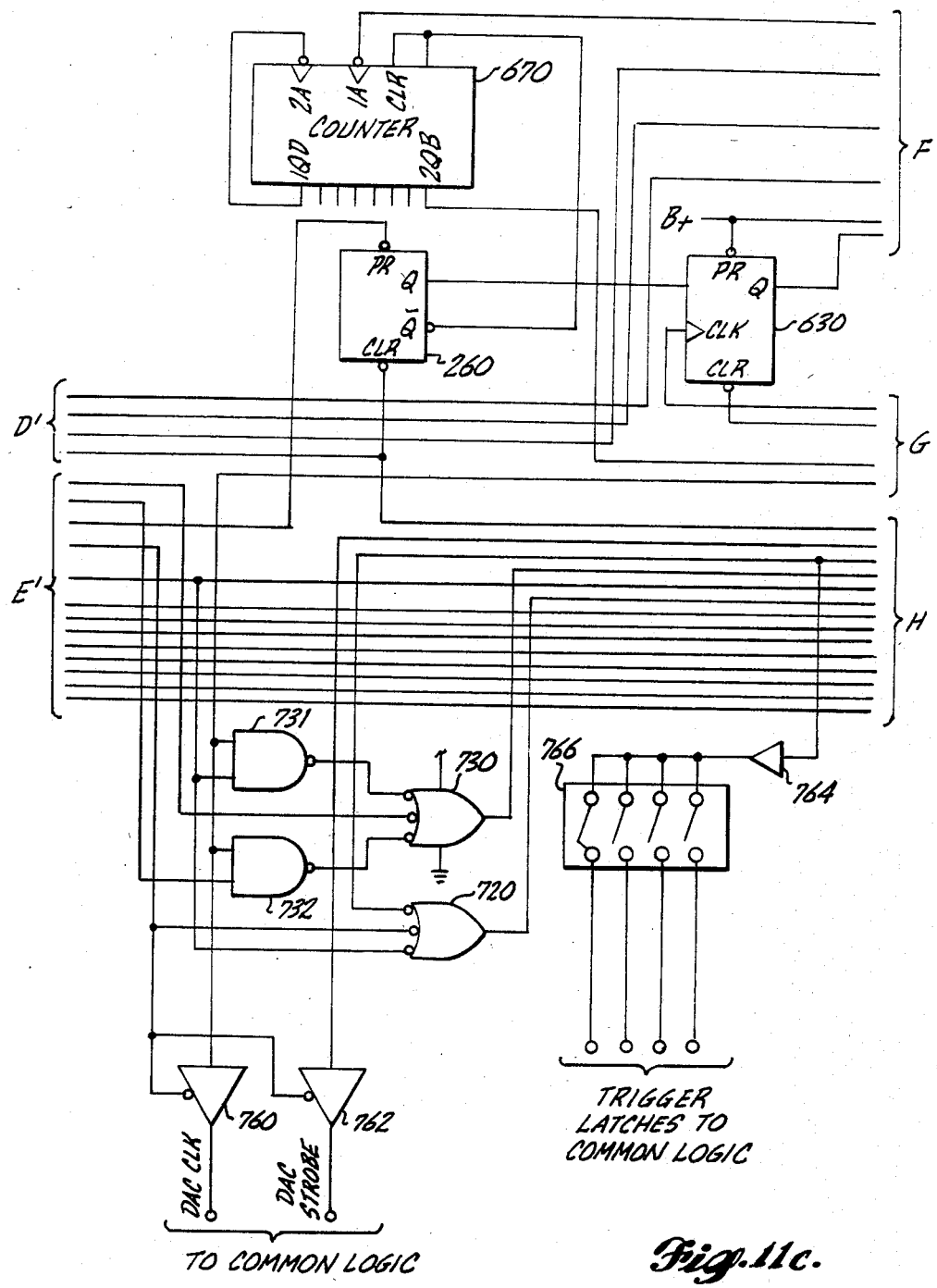
Figure 11D:
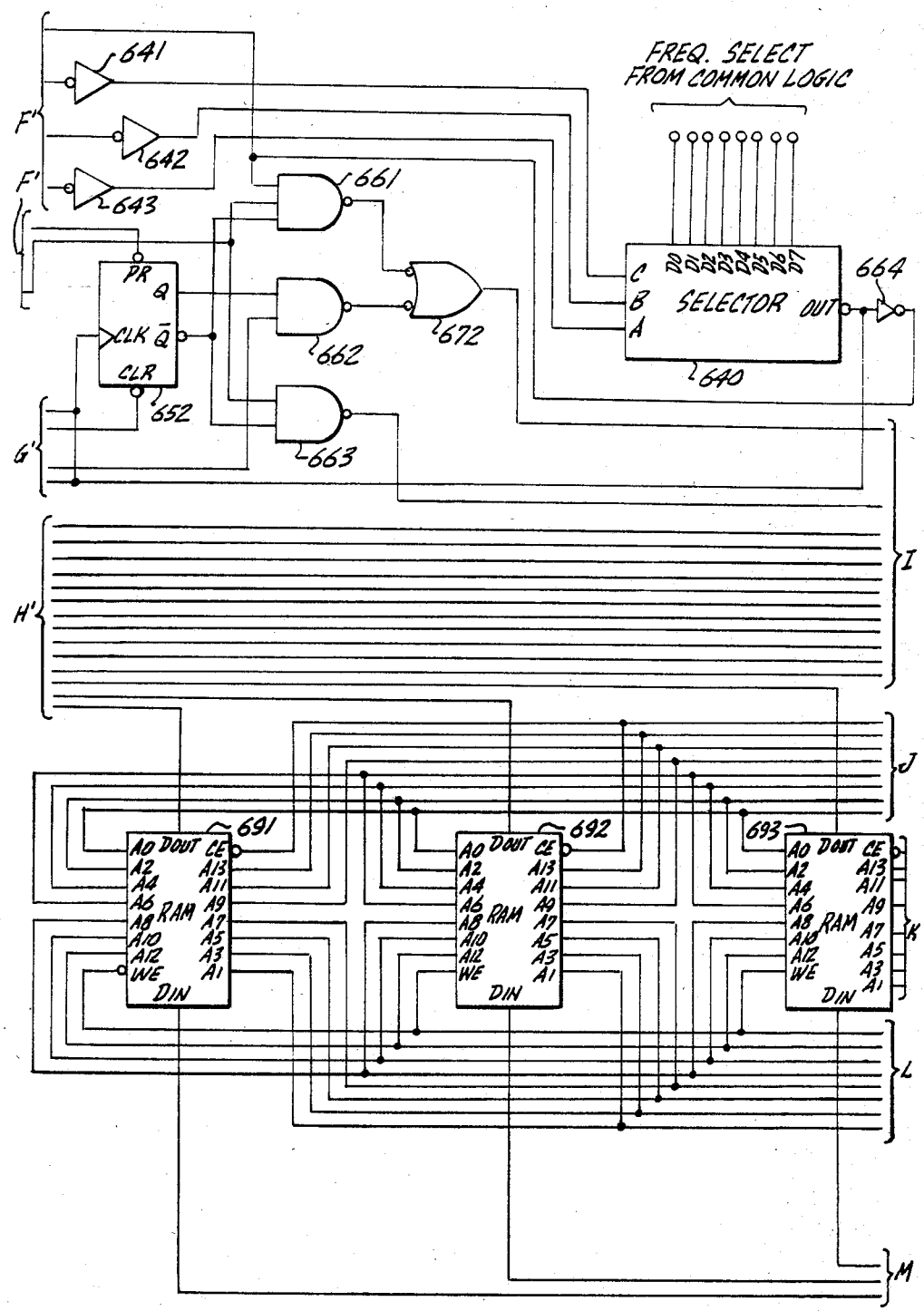
Figure 11E:
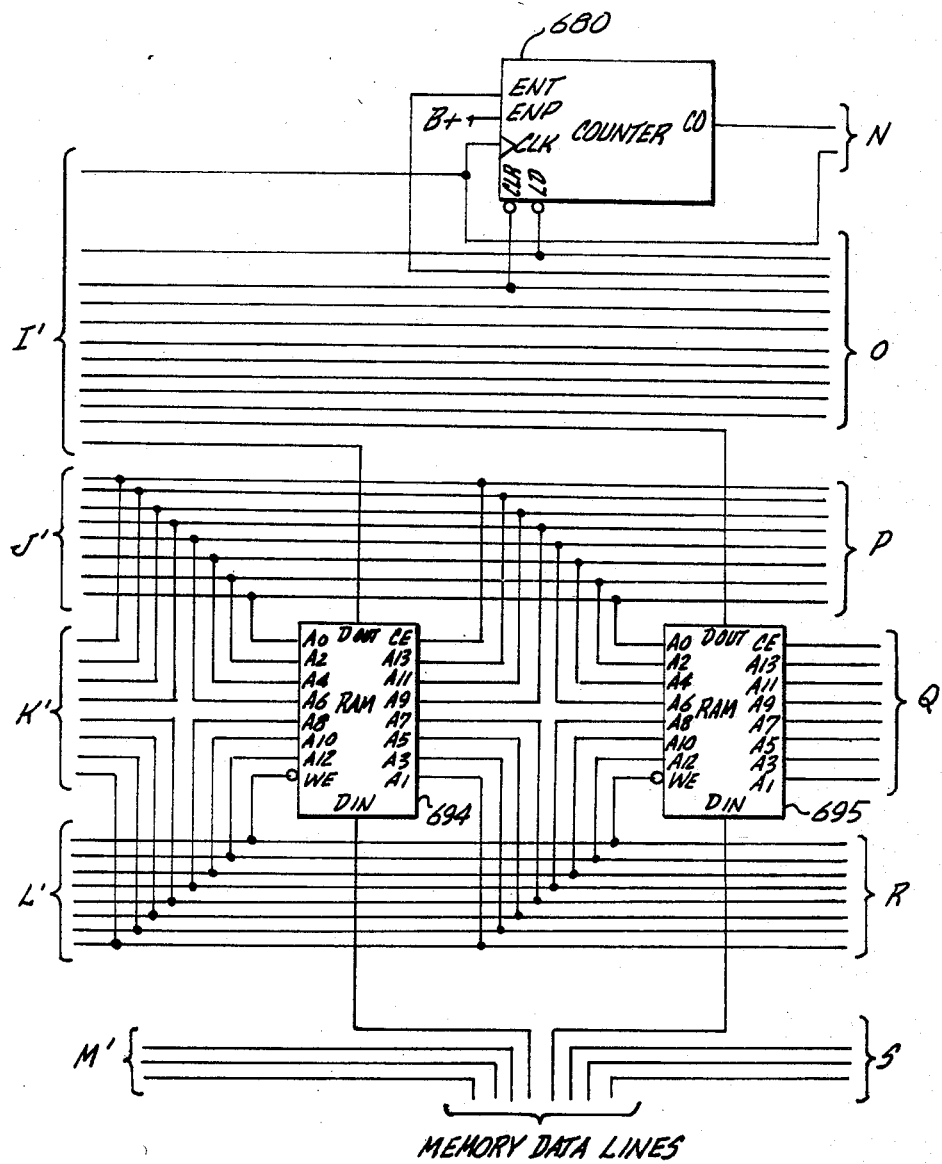
Figure 11F:
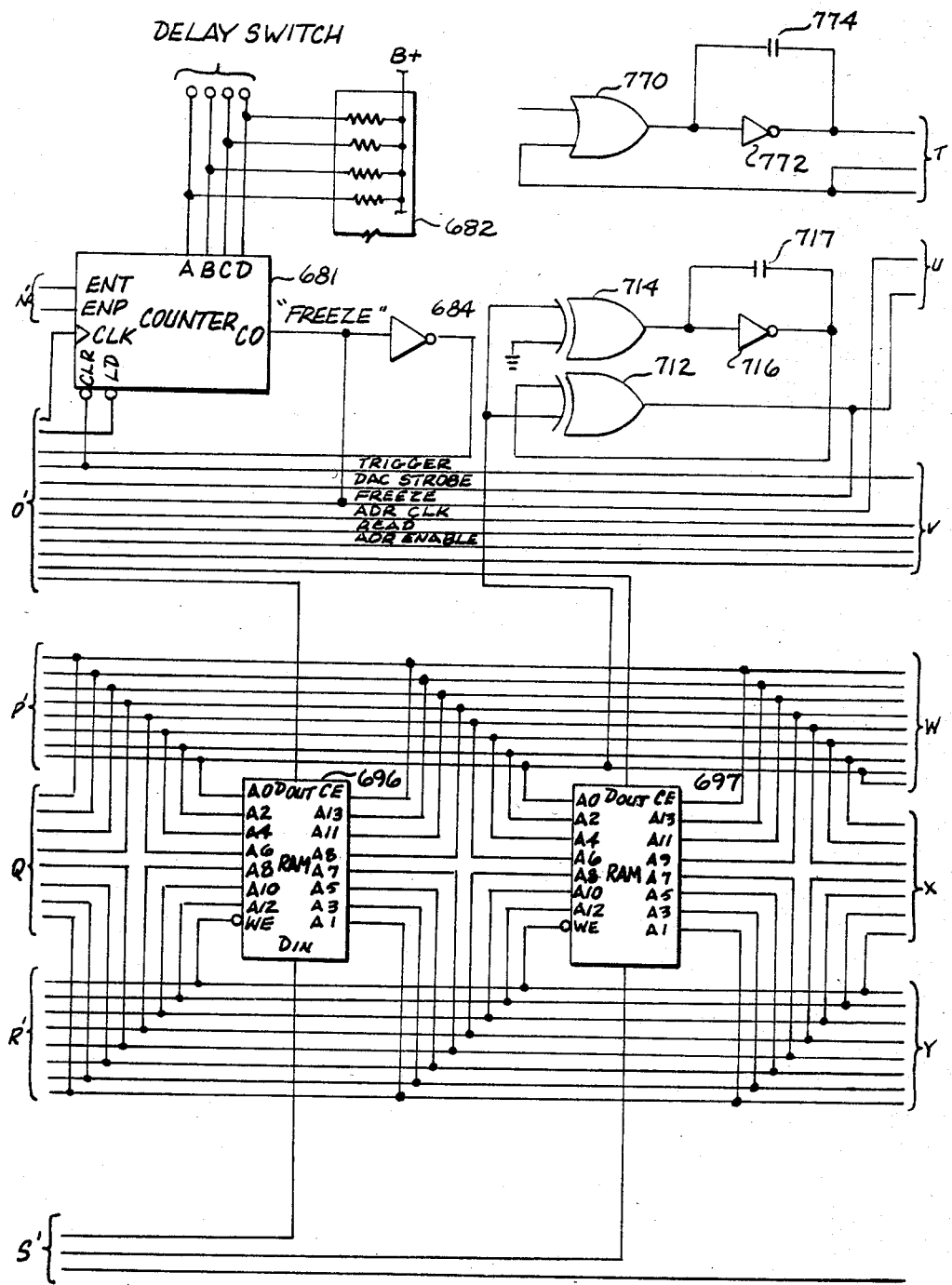
Figure 11G:
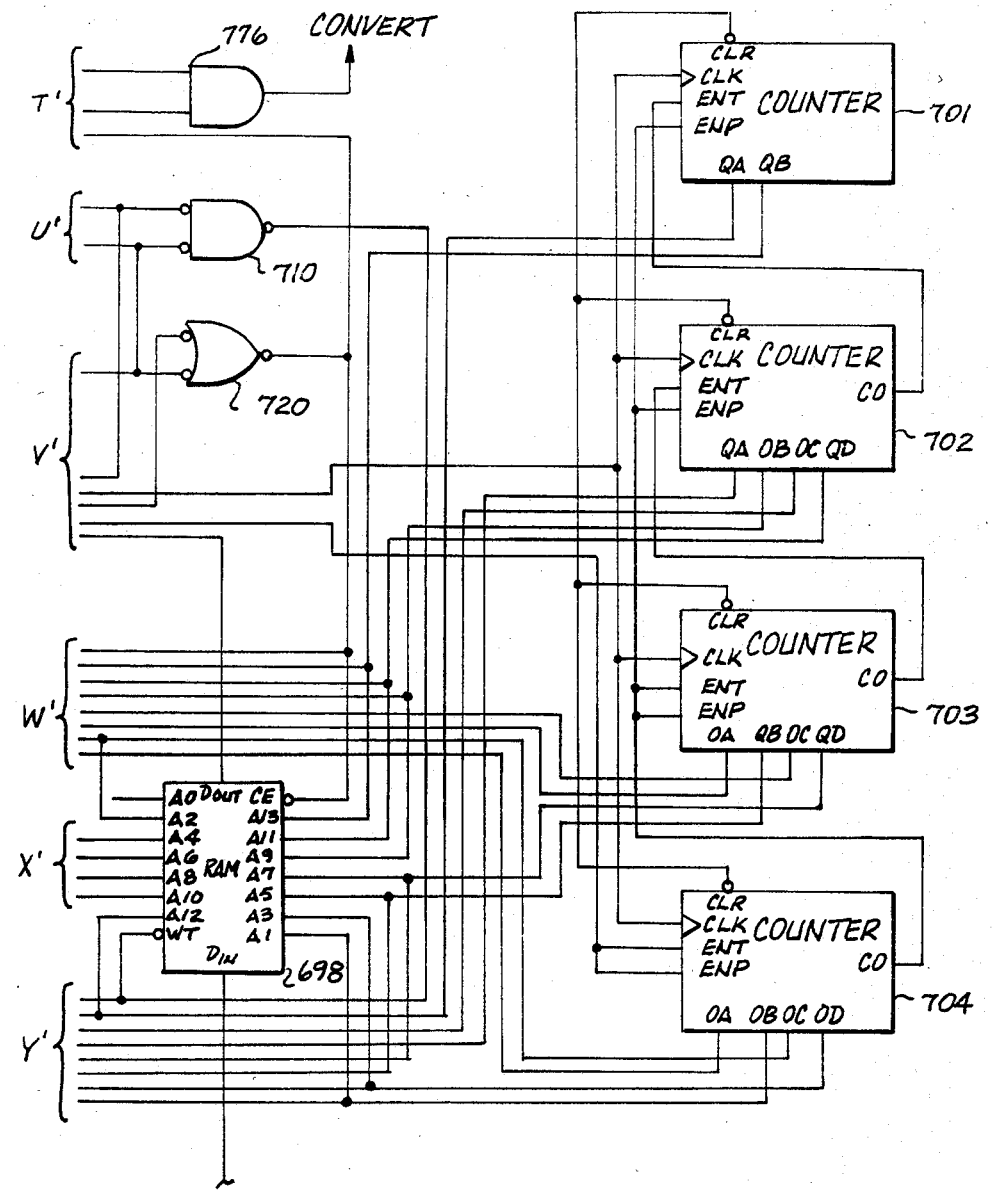

FIGS. 9a through 9c are detailed schematic diagrams illustrating the preferred construction of the common logic (see FIG. 1, reference 14) used in the present power line monitoring system.

A four line data bus, identified as port C from the computer control logic (see FIG. 12) couples to identification circuitry, indicated generally at 402. The identification circuitry includes a bank of four resistors, indicated generally at 404, each of which connects from a source of DC voltage B+ to each input port, and from there through each of four manually settable switches 406 to ground. It is contemplated that the control logic will normally be provided on a printed circuit board, which printed circuit board may be plugged into any one of several provided slots in the power line monitoring chassis. To identify to the computer the location of a particular channel logic board, a selected one of the switches 406 is set, thereby applying its trigger detect signal to a unique one of the port A data bus lines. The computer control logic determines the channel identification by means of the port A data line on which the trigger appears.

As mentioned hereinabove, and described in detail hereafter, all channels share a digital-to-analog converter. The clock signal for this digital-to-analog converter is coupled from a computer control logic selected channel to an input line 410. This signal is then routed to the clock "CLK" input terminal of each of three sequentially connected counters 411 through 414. Each of the counters 411 through 414 is, preferably, comprised of a type SN 74LS163N integrated circuit. The counters 411 through 414 are connected in a chain, such that the carry-out (CO) from counter 411 couples to the ENABLE P, and ENABLE T (EN P, EN T, respectively) inputs of the second counter 412. This signal is also applied to the EN P inputs of counters 413 and 414. The carry-out output from counter 412 couples to the ENABLE T input of counter 413. Finally, the carry-out terminal from counter 413 couples to the ENABLE T input of counter 414.

The function of the counters 411 through 414 is to count up to the highest memory location of any channel memory. Thus, in one construction of the invention, each channel memory is comprised of 16,384 memory locations. The counters 411 through 414 are configured to produce an output pulse after 16,384 digital-to-analog converter pulses. This output pulse appears at the $O_B$ output of counter 414, where it is buffered through a buffer stage 416. The pulse out of buffer 416 "points" to the first data entry point of a recorded signal in each channel memory. It is used, therefore, as the digital-to-analog converter sync signal to be applied at the front panel output jack for use in triggering an oscilloscope, and it is also routed back to the channel circuits to provide information as to the first data entry location.

The basic channel selection portion of the control logic is provided by a 3-to-8 line decoder/demultiplexer 420, preferably a type SN74LS138N integrated circuit. Decoder 420 receives an address, from port C of the computer, at its address inputs A, B, C and G2A. In response to the binary address at its inputs, the decoder activates an appropriate one of its outputs $Y_0$-$Y_3$. Each output corresponds to a predetermined one of four channel circuits. The outputs from decoder 420 are buffered in buffers 421 through 424 before being coupled back to the channel circuits. The computer control logic, therefore, accesses any one of four channel circuits by applying an appropriate binary signal to its port C data bus.

As described above, the discussed more fully hereinbelow, each channel circuit produces a trigger detect signal in response to an input signal exceeding a threshold limit. The trigger detect latch lines from each of four channel boards are routed to four input connectors, indicated generally at 430, in the control logic. Each trigger latch line connects to a corresponding input of an octal buffer 432, preferably comprised of a type SN74LS244N integrated circuit.

A line from the port B bus (FIG. 12) from the computer control logic is applied to the gate inputs of octal buffer 432. The four outputs IY1-IY4 from octal buffer 432 connect to the port A data bus of the computer control logic.

In operation, the computer periodically senses for a trigger detect signal by issuing a gate signal on the port B line to octal buffer 432. This transfers the input data to output latches in octal buffer 432, whereby the computer control logic, by monitoring its port A data line can determine which, if any, of the channels exhibits a trigger condition.

Also connected to the port A data line is an octal flip flop 440, preferably comprised of a type SN74LS374N integrated circuit, at its inputs 1D-8D. The outputs 1Q-8Q from octal flip flop 440 connect to the inputs B1-B8 of a digital-to-analog converter 442, preferably comprised of a type DAC0800LCN integrated circuit. The converter 442 responds to a digital signal at its inputs B1-B8 to produce a corresponding analog current $I_{OUT}$ at its output. This signal is amplified via amplifying stage 444 to produce the digital-to-analog converter output signal which couples to the front panel jack for connection to an oscilloscope.

In operation, the data stored in the memory of a selected channel circuit is coupled from the computer control logic to the port A data bus. This data is then gated through octal flip flop 440 in response to a clock signal provided by a digital-to-analog converter signal, provided from the channel boards. The converter 442 converts the digital input signal to a corresponding analog output, which output represents the reconstituted analog waveform, as stored in memory.

The final portion of the control logic is the sampling clock generator, indicated generally at 450. The sampling clock generator includes a crystal oscillator, indicated generally at 452. Crystal oscillator 452 is comprised of a crystal 454 which is paralleled by a series connection of buffers 456, 458, in turn paralleled by a pair of resistors 460, 462. The clock signal produced by crystal oscillator 452 is buffered via amplifier 464 before being applied to each clock input of a pair of counters 470, 472. The counters 470, 472, preferably comprised of type SN74LS163N integrated circuits, are series connected, with the carry output of counter 470 being coupled to the ENABLE P and T inputs of counter 472. In this manner, each output $O_A$-$O_D$ of each counter 470, 472 carries a divided form of the signal produced by the crystal oscillator 452. The frequency of oscillation of the crystal oscillator 452, and the appropriate divisors, as determined by counters 470 through 472, are selected to provide a range from the lowest to the highest desired sampling rates of the analog-to-digital converters in the channel circuits.

FIGS. 10A through 10D are detailed schematic diagrams illustrating the variable attenuator, input amplifier, trigger detector and analog-to-digital converter portions of a channel circuit (FIG. 1, numeral 12).

There is one channel signal provided for each channel system. In the present embodiment, four channel circuits are used. Inasmuch as each channel circuit contains identical circuitry, only one such channel circuit will be described.

The analog signal from a power line being monitored is applied to the input of an input attenuator 502. Input attenuator 502 is of conventional design, dividing the input voltage from the power line into a corresponding level suitable for use by subsequent circuitry.

The input attenuated signal is applied to an amplifier, indicated generally at 504. Amplifier 504 includes a gain stage 506, preferably comprised of a type LH0033CJ integrated circuit. The gain stage 506 has low frequency compensation feedback circuitry including a capacitor 507 which connects from the output of gain stage 506 to the common of two resistors 508, 509 which connect between the input to gain stage 506 and ground, and has its input voltage limited to levels between clamping voltages B+ and B− by voltage limiting circuitry indicated generally at 510.

The output from amplifier 504 is passed through a low pass filter 512. Low pass filter 512 operates to attenuate any frequency above one-half of the maximum sampling rate used in the subsequent analog-to-digital converter. Filter 512 is commonly referred to as an antialiasing filter.

The output from low pass filter 512 is applied to the input of the threshold detection circuitry, indicated generally at 520. Threshold detection circuitry 520 includes an input buffer amplifier 522, the output from which feeds to the input of a dual differential 524. Dual differential comparator 524 is, preferably, comprised of the type NE522N integrated circuit. Comparator 524 receives a positive voltage reference threshold level from the output of a buffer amplifier 526, and a negative voltage reference threshold level from the output of an amplifier 528. The positive voltage reference level is user settable via a potentiometer 530, having one end connected to the minus DC supply B−, with its remaining end connected through a resistor 532 to the positive DC supply B+. Similarly, the negative threshold reference level as buffered through amplifier 528 is user settable via a potentiometer 534 which connects to the negative DC supply B− through a resistor 536 and to the positive DC supply B+ through a resistor 538.

Comparator 524 produces a trigger detect output signal in response to the analog signal at its inputs exceeding either of the user settable threshold levels.

The output from low pass filter 512 is also passed to the input of the reference and voltage regulators, indicated generally at 540, for the analog-to-digital converter. The filtered analog signal is coupled to the input of a buffer amplifier, indicated generally at 542. Buffer amplifier 542 is comprised of an operational amplifier gain stage 544, the output of which is buffered through a transistor stage 546. The bias voltage B++ to the operational amplifier 544 is highly regulated from an amplifying stage 550 which receives a reference voltage from a stable reference voltage source 552. A potentiometer 554 from the reference voltage 552 allows a user to set the input bias level to operational amplifier stage 544. This, in turn, allows operator selection of the offset into the analog-to-digital converter.

The range of the analog-to-digital converter may be adjusted via a potentiometer 560. Potentiometer 560 connects from the reference voltage source 552 to ground, with its movable contact being connected to the input of a high gain amplifying stage, indicated generally at 562. The high gain amplifying stage 562 is comprised of an operational amplifier 564, which receives the voltage at the movable tap of potentiometer 560, and whose output is buffered by a transistor stage 566. Bias to transistor 566 is highly regulated by a gain stage 570, comprised of an operational amplifier 572 and a Darlington buffer stage 574. Amplifying stage 570 produces a stable voltage output B+ which is function of the reference voltage 552.

The range adjust voltage out of gain stage 562 is applied at the range control input $V_{RB}$ of a digital-to-analog converter 580. Also, the offset adjusted analog signal, from gain stage 542 is coupled to the analog input $V_{IN}$ of the converter 580.

Analog-to-digital converter 580, preferably a type TDC1007J integrated circuit, operates in the normal manner to convert input analog signals, supplied at its $V_{IN}$ input to a corresponding digital signals at its outputs D0–D7. The conversion is controlled at a rate determined by the signal at the "CONVERT" input. The digital signals out of converter 580, the "CONVERT" input to converter 580, and the produced trigger detect signal all connect to the remainder of the channel circuit logic, illustrated in FIGS. 11A through 11G.

FIGS. 11A through 11G are detailed schematic diagrams illustrating the preferred construction of the timing and control circuitry, and the solid state memory which form the remainder portion of the channel circuit.

The trigger detect signal is passed to the first terminal of a jumper terminal pair 602, 603. The second terminal 603 connects to the trigger input of a successive one of the channel circuits. By installing a jumper wire between terminal pair 602, 603, a trigger signal may be directly "wire—OR'd" with the triggers of other channels such that a transient condition on any channel triggers all channels so jumpered. By insertion of a conventional diode, such as diode 604, the trigger signal in the channel circuit shown may be used to form a master/slave relationship with one or more other channel circuits. In this way, a trigger detect signal from the higher priority "master" channel will cause simultaneous triggering in all lower priority "slave" channels. Note, however, due to the action of diode 604 that a triggering in a slave channel will not cause a corresponding triggering in a master channel.

The trigger detect signal is also passed to the input of a gate 610. Gate 610 has, as its remaining input, the output from a gate 614. Gate 614 has as inputs the third output PB2 of the port B data bus from the control logic, and the output from a channel select control switching 616. As described hereinabove, the common logic activates one of four output lines to select one of four channel circuits. The channel control switching 616 permits a user to close one of four single pole/single throw switches to thereby assign a particular circuit board an identification of 1 through 4.

The third data line of the port B data bus is activated by the control logic in a test mode wherein all channels are forced to a trigger condition. Thus, gate 610 produces an output trigger set signal in response to either receiving a trigger detect signal from prior processing circuitry, or a forced trigger condition from the control logic.

The trigger set signal out of gate 610 is passed to an input of a latch 620, preferably a type SN74LS74AN integrated circuit. In response to receiving the trigger set signal, latch 620 activates its Q output to a trigger latch mode. The Q output of latch 620 remains in the trigger latch mode until a reset signal is applied to the clear "CLR" input of latch 620. Such a trigger clear signal is supplied from a gate 624 which receives at its inputs the output from the channel select switching 616 and the second line of the port B data bus from the control logic. In this way, the control logic may reset the channel circuit from the triggered to the normal monitoring modes.

The trigger latch signal out of latch 620 is coupled to the D input of a flip flop 630. Coupled to the clock input of flip flop 630 is the selected sampling frequency.

The selected sampling frequency is obtained as follows. As described hereinabove, the common logic circuit produces a series of eight sampling clock frequencies. These eight sampling frequencies are coupled to the inputs D0–D7 of a 1-of-8 data selector 640. Data selector 640 is, preferably, a type SN74LS151N integrated circuit. One of the eight inputs D0–D7 is connected to the output "OUT" in response to a binary signal appearing at the address inputs A–C. The address signals, as buffered through buffers 641 through 643 are determined by the settings of an interval switch on the front panel of the power line monitor. This switch connects via an input connector, indicated generally at 646, to the channel circuit. Resistors, provided in resistor group 650 connect the input lines to a source of bias B+ to set proper logic levels.

The selected sampling frequency out of selector 640 is also routed to the clock input of a flip flop 652. The D input to flip flop 652 is driven from the Q output of flip flop 630. The Q output from flip flop 652 is applied to an input of the second, 662, of three gates 661 through 663. The $\overline{Q}$ output from flip flop 652 is applied to inputs of the first and third gates 661, 663. The remaining inputs to the first gate 661 include the Q output from flip flop 630 and the selected sampling frequency out of data selector 640, as buffered and inverted in inverter 664. The remaining input to gate 663 is the Q output of gate 630. The remaining input to gate 662 is the 2QB output from a binary counter 670. Binary counter 670, preferably a type SN74LS393N integrated circuit, receives at its clock input the selected sampling frequency out of inverter 664. Applied to the clear "CLR" input of binary counter 670 is the $\overline{Q}$ output from the trigger latch flip flop 620.

The outputs from gates 661, 662 feed to the inputs of a gate 672.

The logic provided by flip flops 630, 652 and gates 661, 662 and 672 produces at the output of gate 672 a series of pulses at the sampling frequency, which pulses are synchronized with a trigger signal. The output from gate 663 is a single pulse synchronized with the initial pulse of the pulse train out of gate 672.

The single pulse out of gate 663 is applied to the load LD inputs of a pair of counters 680, 681. The pulse train out of gate 672 is applied to the clock "CLK" inputs of counters 680, 681. The counters 680, 681, preferably type SN74LS163AN integrated circuits, are connected in a chain, such that the carry output "CO" of counter 680 is connected to the ENABLE P input of counter 681. The count in counters 680, 681 may be preset via preset inputs A–D. The preset inputs A–D are connected to the delay switch, which is provided on the front panel of the power monitor. A resistor array 682, connected to a source of bias B+ assures the proper logic levels to the inputs of the counters 680, 681.

In operation, the counters 680, 681 are loaded to a preset value corresponding to the amount of delay desired before the system freezes its memory after receipt of a trigger signal. Trigger pulses out of gate 672 increment the count in counters 680, 681 at the sampling frequency rate until both counters have counted to their "full" state whereby counter 681 produces a carry output pulse. This carry output pulse constitutes a "FREEZE" signal which, as will be understood hereinbelow, freezes the contents of the memory. In addition, the FREEZE signal, as inverted through inverter 684, disables the counters 680, 681 at the ENABLE T input to counter 680. The counters 680, 681 will remain in the frozen condition until receiving a trigger clear reset signal from the control logic at their clear CLR inputs.

Solid state memory for the channel circuit is provided by eight static random access memories (RAMS) 691 through 698. Each RAM is preferably a 16K by one bit type IMS 1400S-55 integrated circuit. The memory data lines D0–D7 from the analog-to-digital converter (FIGS. 10A through 10D) are fed, respectively, to the digital inputs $D_{IN}$ of each RAM 691 through 698. Each memory 691 through 698 is addressed at its address inputs A0–A13 from a series of memory address counters 701 through 704. Data is written into the RAMS 691 through 698 in response to each RAM receiving a write enable "WE" signal. This WE signal is produced at the output of a gate 710. Gate 710 receives at its inputs both the "FREEZE" signal, out of counter 681, and a DAC STROBE signal, produced out of a gate 712. Gate 712 receives at its inputs the A0 memory address line, out of address counter 704, and the A0 memory address line as differentiated by a gate 714, an inverter 716 and a capacitor 717. Thus, in the absence of a freeze condition, and with each change of state of A0, data may be written into the RAMS 691 through 698.

In addition, the RAMS 691 through 698 are enabled via a chip enable input CE which is applied from the output of a gate 720. Gate 720 receives at its inputs the output from gate 712 and a "READ" input which is coupled through a gate 716. Gate 716 receives at its inputs the output of the channel select switch 616 and the fourth line on the port B data bus from the control logic. In this way, when the control logic wants to read data out of the RAMS 691 through 698, it activates its fourth port B data line.

The memory address counters 701 through 704 are, preferably, comprising of type SN74LS163AN integrated circuits. The counters 701 through 704 are chained such that the carry output "CO" from counter 704 is applied to the ENABLE T and P inputs of counter 703 and the enable P inputs of counter 702, 701. Correspondingly, the carry output of counter 703 is applied to the ENABLE T input of counter 702, with the carry output of counter 702 being applied at the ENABLE T input of counter 701.

Counter 704 is enabled, at its ENABLE T and P inputs via an address "ADR" ENABLE signal. The address enable signal is produced at the output of a gate 720. Gate 720 receives at its inputs the FREEZE signal, the READ signal, out of gate 716 and a DAC signal, produced at the $\overline{Q}$ output of a flip flop 722. Flip flop 722 receives at its clock input the DAC/SYNC signal produced by the common logic board. Flip flop 722 is activated in response to a control signal from the output of a gate 726. Gate 726 receives at its inputs the output from the channel select switching 616 and the seventh line PB6 on the control logic port B data bus. The control logic can, by applying a control signal to this line, force the flip flop 722 to enable the digital-to-analog converter, as shown in FIGS. 10A through 10D.

The clock input to each memory address counter 701 through 704 receives an address "ADR" CLOCK input signal, which is provided at the output of a gate 730. Coupled to the inputs of gates 730 are the outputs from a pair of gates 731, 732, and the output from a gate 734. Gate 734 has as its inputs the output from the channel select switching 616 and the first data line PBO on the control logic port B data bus. When the control logic wants to read data from the memory into the tape, it steps through the memory by sequentially producing pulses on its first port B data line. This STEP signal is, therefore, coupled through gate 730 and used as an address clock.

Gate 731 receives as its inputs the selected clock frequency, out of data selector 640 and the READ signal, out of gate 716.

Gate 732 receives as its inputs the selected clock frequency, out of data selector 640 and a DAC ENABLE signal, provided as the Q output of flip flop 722.

In response to the various aforedescribed control signals, the memory address counters 701 through 704 increment their count at the selected sampling rate to thereby load digital signals from the analog-to-digital converter into selected portions of the memory within RAMS 691 through 698. This process continues until a FREEZE signal is received.

The control logic may remove the digital signals frozen in the RAMS 691 through 698 by activating the write enable "WE" line. In this mode, the control logic sequentially steps through the memory to extract all of the data.

The digital data out of RAMS 691 through 698 is carried on lines M0-M7 to the inputs 1A1-2A4 of an octal bus driver 740. In response to a READ signal from gates 716, the data may be latched to the output terminals 1Y1-2Y4 of latch 740 and loaded onto the control logic port A data bus. The control logic may then, in the aforedescribed manner, load the data into permanent storage, such as magnetic tape, or recirculate the data to the digital-to-analog converter of the common logic for the purpose of reconstructing the waveform and permitting operator review on an oscilloscope.

By activating its fifth port B data line PB4, the control logic may activate a gate 742, which gate receives as its second input the output from the channel select switching 616, to thereby produce an output from gate 742 which is applied to the gate inputs of an octal buffer 744. Octal buffer 744 receives at its inputs 1A1-2A4 the status of the interval switch on the front panel, and a portion of the status of the attenuator switches, also provided on the front panel. The control logic, by activating gate 742 can latch this information to the outputs 1Y1-2Y4 of buffer 744, and, via its port A data bus, read the status of the switches. The remaining attenuator switch positions are monitored via an octal buffer 746. Octal buffer 746 is activated via a gate 748. Gate 748 receives at its inputs the output from the channel select switching 616, and the sixth data line PB4 on the port B data bus. The logic level inputs to the octal buffer 746 are set by a resistor array 750 which couples to a source of bias voltage B+.

The selected clock frequency out of data selector 640 is routed to the input of an output gate 760. Similarly, the DAC STROBE signal produced at the output of gate 712 is applied to the input of a gate 762. Gates 760, 762 are activated in response to a DAC signal, out of flip flop 722. In this manner, both the digital-to-analog converter clock and strobe signals are coupled to the common logic.

The FREEZE signal is passed through a buffer 764 and applied to the input contacts of four switches in a switch matrix 766. The operator sets an appropriate one of the switches in the switch matrix 766 to cause the FREEZE signal to be coupled through the common logic to the appropriate channel circuit.

The gates 770, 776, inverter 772 and capacitor 774 act as a differentiator and produce pulses at the trailing edge of each chip enable pulse. The pulses are passed to the analog-to-digital converter (FIG. 10D) causing conversion of the next converter input to memory.

The chip enable CE signal out of gate 720 is fed to one input of a gate 770, whose remaining input is grounded. The output of gate 770 connects to the input of an inverter 772 which has a capacitor 774 connected from output to input. The output from inverter 772 connects, along with the CE signal, to a gate 776.

Figure 12:
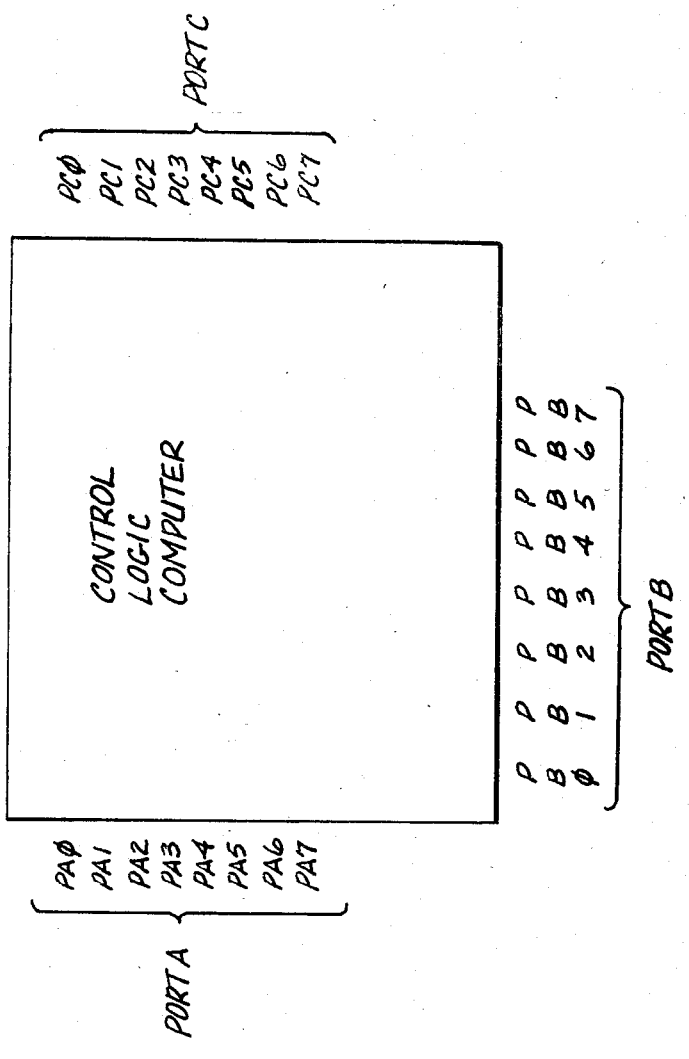
FIG. 12 is a block diagram illustrating input and output port configurations for the preferred microprocessor control logic.

FIG. 12 is a block diagram illustrating the control logic computer used in the preferred embodiment of the invention.

The control logic is, preferably, a type 8085 controller board, available from Synapse Corporation, North Bedford, Mass.

The control logic includes a port A bus, comprised of eight data lines PA0-PA7. The port A data bus is used to carry all data inputs.

A port B data bus, comprised of eight data lines PB0-PB7, is used to monitor all control functions, such as front panel control inputs.

A port C data bus is comprised of eight lines PC0-PC7 and is used to select the appropriate one of the channel circuits.

In summary, an improved power line data monitoring system has been described in detail. The system is operable to monitor multiple power lines simultaneously. In addition, the system may be set in an automatic mode, wherein transient signals recorded by each channel are automatically loaded into permanent storage, or a manual mode in which data may be reconstituted and viewed by an operator on an oscilloscope before being committed to permanent storage. In addition, the system is operator controlled to store a selected amount of both pre- and post trigger information. Where multiple channels are triggered, a priority scheme processes each channel in sequence, returning the processed channel to its monitoring mode. An operator may select the file size of channel memory which is to be committed to permanent storage. In addition, operator controls allow selection of any of several desired data sampling rates. Further, the channels may be operated in a master/slave triggering mode, whereby a trigger in the master channel correspondingly triggers all slave channels. In addition, when data signals are to be loaded into permanent storage, a real time signal may be stored therewith, as well as signals representing other parameters associated with the stored signals. Further, where a pair of magnetic tape units are used for permanent storage, the control logic includes a means for sensing the condition of the first magnetic tape unit being loaded, to thereby begin storing the remaining digital signals into the second magnetic tape unit.

While a preferred embodiment of the invention has been described in detail, it is apparent that many modifications and variations thereto are possible, all of which fall within the true spirit and scope of the invention.

The embodiments of the invention in which an exclusive property or privilege is claimed are defined as follows:

1. Apparatus for monitoring a plurality of electrical power carrying lines comprising:
    a plurality of channel circuits, each channel circuit including:
        (a) an input adapted to be coupled to one of said power carrying lines for sensing the signal thereon,
        (b) trigger detector means for producing a trigger detect signal in response to said sensed signal at said input exceeding a predetermined reference level,
        (c) analog-to-digital converter means for controllably converting said sensed signal at said input to corresponding digital signals,
        (d) memory means for controllably storing said analog-to-digital converter means produced digital signals, and
        (e) timing and control circuit means responsive to control signals for controlling said analog-to-digital converter means and said memory means;
    a common logic circuit comprising:
        (a) a sampling clock generator means for producing a sampling clock signal, said sampling clock signal being coupled to each channel circuit timing and control circuit means for controlling the sampling rate of the corresponding analog-to-digital converter,
        (b) channel select logic means responsive to control signals for selecting a predetermined one of the plurality of channel circuits, and
        (c) digital-to-analog converter means for converting the stored digital signals in a selected channel circuit memory means to a corresponding analog signal; and
    control logic means for controlling the operation of the channel circuits and the common logic circuit in either a selected manual or an automatic mode, said control logic means including storage means for controllably storing digital signals,
    the control logic means being operable in the manual mode for:
        (a) responding to a trigger detect signal produced by the trigger detector means of a channel circuit to cause the channel select logic means to select said channel circuit such that an analog signal out of said digital-to-analog converter means is provided for review by an operator, and
        (b) providing an operator with a means for loading the digital signals stored in the memory means of said selected channel circuit into said storage means,
    the control logic means being operable in the automatic mode for:
        responding to a trigger detect signal produced by the trigger detector means of a channel circuit to cause the memory means of said channel circuit to load the digital signals stored therein into said storage means; said control logic means including means operable in the manual mode and the automatic mode for assigning a predetermined priority to each of the channel circuits such that in the even at least two trigger detector means produce trigger signals simultaneously, each circuit channel is processed in the order of its assigned priority.

2. The apparatus of claim 1 wherein said timing and control circuit means includes means for controlling the memory means such that:
    (a) in the absence of a trigger signal produced by an associated trigger detector in the same channel circuit, successive digital signals from the analog-to-digital converter are stored in successive memory locations of said memory means until said memory means is fully loaded at which point subsequent digital signals are stored in successive memory means locations thereby erasing the previously stored digital signals, whereby the digital signals stored in said memory means at any given time represent the most recent, successive analog-to-digital produced digital signals,
    (b) upon the occurrence of a trigger signal from an associated trigger detector in the same channel circuit, the memory means is caused to inhibit storing additional digital signals once it has stored a predetermined number of digital signals subsequent to the occurrence of said trigger signal, whereby the memory means is controlled to store a predetermined number of digital signals prior, and subsequent to the occurrence of said trigger signal.

3. The apparatus of claim 2 wherein the timing and control means includes means for allowing an operator to control the number of digital signals which are stored in the memory means prior, and subsequent to the occurrence of said trigger signal.

4. The apparatus of claim 2 wherein the control logic means includes means operable in the manual mode and the automatic mode for assigning a predetermined priority to each of the channel circuits such that in the event at least two trigger detectors produce trigger signal simultaneously, each circuit channel is processed in the order of its assigned priority, with an inhibit of a memory means being removed, and the corresponding channel circuit being reset to store digital signals, upon the occurrence of one of:

(i) an operator input command to resume storing of the digital signals in the memory means, (ii) completion of the loading of all of the digital signals stored in said memory means into said storage means.

5. The apparatus of claim 4 wherein said sampling clock generator means provides a plurality of sampling clock signals, each sampling clock signal being of a different predetermined frequency, and wherein the control logic means includes operator input controls for controlling the timing and control circuit means of each channel circuit such that a user selected one of the sampling clock signals is coupled to the associated analog-to-digital converter for controlling the sampling rate thereof.

6. The apparatus of claim 4 further including means for establishing a trigger link relationship between any two operator selected chanel circuits such that a trigger detect signal produced by one channel causes a trigger detect signal to be produced in the other channel.

7. The apparatus of claim 4 wherein said control means further includes means operable in the manual mode for continuously cycling the digital signals stored by the memory means of the selected channel circuit to the digital-to-analog converter means such that the signal produced at the output of the digital-to-analog converter is a repeating sequence viewable by an operator on an oscilloscope.

8. The apparatus of claim 4 wherein said control means includes means for continuously cycling the digital signals stored by the memory means of the selected channel circuit to the digital-to-analog converter means at said sampling clock signal rate such that the signal produced at the output of the digital-to-analog converter is a repeating sequence representative of the signal sensed on the corresponding power carrying line.

9. The apparatus of claim 4 wherein the control logic means includes means for allowing an operator to select a predetermined portion of the digital signals stored in each memory means and load only said selected portion into said storage means.

10. The apparatus of claim 9 further including means for establishing a trigger link relationship between any two operator selected channel circuits such that a trigger detect signal produced by one channel causes a trigger detect signal to be produced in the other channel.

11. The apparatus of claim 9 wherein said sampling clock generator means provides a plurality of sampling clock signals, each sampling clock signal being of a different predetermined frequency, and wherein the control logic means includes operator input controls for controlling the timing and control circuit means of each channel circuit such that a user selected one of the sampling clock signals is coupled to the associated analog-to-digital converter for controlling the sampling rate thereof.

12. The apparatus of claim 9 wherein said control means further includes means operable in the manual mode for continuously cycling the digital signals stored by the memory means of the selected channel circuit to the digital-to-analog converter means such that the signal produced at the output of the digital-to-analog converter is a repeating sequence viewable by an operator on an oscilloscope.

13. The apparatus of claim 9 wherein said control means includes means for continuously cycling the digital signals stored by the memory means of the selected channel circuit to the digital-to-analog converter means at said samplng clock signal rate such that the signal produced at the output of the digital-to-analog converter is a repeating sequence representative of the signal sensed on the corresponding power carrying line.

14. The apparatus of claim 1 wherein the control logic means includes means for allowing an operator to select a predetermined portion of the digital signals stored in each memory means and load only said selected portion into said storage means.

15. The apparatus of claim 14 wherein said control means further includes means operable in the manual mode for continuously cycling the digital signals stored by the memory means of the selected channel circuit to the digital-to-analog converter means such that the signal produced at the output of the digital-to-analog converter is a repeating sequence viewable by an operator on an oscilloscope.

16. The apparatus of claim 14 wherein said control means includes means for continuously cycling the digital signals stored by the memory means of the selected channel circuit to the digital-to-analog converter means at said sampling clock signal rate such that the signal produced at the output of the digital-to-analog converter is a repeating sequence representative of the signal sensed on the corresponding power carrying line.

17. The apparatus of claim 14 wherein said sampling clock generator means provides a plurality of sampling clock signals, each sampling clock signal being of a different predetermined frequency, and wherein the control logic means includes operator input controls for controlling the timing and control circuit means of each channel circuit such that a user selected one of the sampling clock signals is coupled to the associated analog-to-digital converter for controlling the sampling rate thereof.

18. The apparatus of claim 14 further including means for establishing a trigger link relationship between any two operator selected channel circuits such that a trigger detect signal produced by one channel causes a trigger detect signal to be produced in the other channel.

19. The apparatus of claim 1 wherein said sampling clock generator means provides a plurality of sampling clock signals, each sampling clock signal being of a different predetermined frequency, and wherein the control logic means includes operator input controls for controlling the timing and control circuit means of each channel circuit such that a user selected one of the sampling clock signals is coupled to the associated analog-to-digital converter for controlling the samping rate thereof.

20. The apparatus of claim 19 further including means for establishing a trigger link relationship between any two operator selected channel circuits such that a trigger detect signal produced by one channel causes a trigger detect signal to be produced in the other channel.

21. The apparatus of claim 19 wherein said control means further includes means operable in the manual mode for continuously cycling the digital signals stored by the memory means of the selected channel circuit to the digital-to-analog converter means such that the signal produced at the output of the digital-to-analog converter is a repeating sequence viewable by an operator on an oscilloscope.

22. The apparatus of claim 19 wherein said control means includes means for continuously cycling the digital signals stored by the memory means of the selected channel circuit to the digital-to-analog converter means at said sampling clock signal rate such that the signal produced at the output of the digital-to-analog converter is a repeating sequence representative of the signal sensed on the corresponding power carrying line.

23. The apparatus of claim 1 further including means for establishing a trigger link relationship between any two operator selected channel circuits such that a trigger detect signal produced by one channel causes a trigger detect signal to be produced in the other channel.

24. The apparatus of claim 23 wherein said control means further includes means operable in the manual mode for continuously cycling the digital signals stored by the memory means of the selected channel circuit to the digital-to-analog converter means such that the signal produced at the output of the digital-to-analog converter is a repeating sequence viewable by an operator on an oscilloscope.

25. The apparatus of claim 23 wherein said control means includes means for continuously cycling the digital signals stored by the memory means of the selected channel circuit to the digital-to-analog converter means at said sampling clock signal rate such that the signal produced at the output of the digital-to-analog converter is a repeating sequence representative of the signal sensed on the corresponding power carrying line.

26. The apparatus of claim 1 wherein said control means further includes means operable in the manual mode for continuously cycling the digital signals stored by the memory means of the selected channel circuit to the digital-to-analog converter means such that the signal produced at the output of the digital-to-analog converter is a repeating sequence viewable by an operator on an oscilloscope.

27. The apparatus of claim 1 wherein said control means includes means for continuously cycling the digital signals stored by the memory means of the selected channel circuit to the digital-to-analog converter means at said sampling clock signal rate such that the signal produced at the output of the digital-to-analog converter is a repeating sequence representative of the signal sensed on the corresponding power carrying line.

28. The apparatus of claim 1 wherein said storage means comprises first and second magnetic tape units, the first magnetic tape unit storing successive digital signals loaded into the storage means, the control logic means sensing the condition wherein the first magnetic tape unit is fully loaded to automatically begin storing successive digital signals in said second magnetic tape unit.

29. The apparatus of claim 1 wherein the control logic means further comprises real time clock means for producing a digital time signal representative of real time and wherein the control logic means includes means for storing a digital time signal in said storage means in association with loading digital signals from a memory means into said storage means.

* * * * *

UNITED STATES PATENT AND TRADEMARK OFFICE
CERTIFICATE OF CORRECTION

PATENT NO. : 4,589,074

DATED : May 13, 1986

INVENTOR(S) : Teddy R. Thomas et al.

It is certified that error appears in the above-identified patent and that said Letters Patent is hereby corrected as shown below:

On the title page, Item /75/ Inventors: add
-- James W. Daniels, Marysville, and Donald R. Shuler, Seattle, WA. --

Signed and Sealed this

Nineteenth Day of August 1986

[SEAL]

Attest:

DONALD J. QUIGG

Attesting Officer

Commissioner of Patents and Trademarks